(12) United States Patent
Knoedgen

(10) Patent No.: US 6,949,937 B2
(45) Date of Patent: Sep. 27, 2005

(54) DIFFERENTIAL CAPACITANCE MEASUREMENT

(75) Inventor: Horst Knoedgen, Munich (DE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 35 days.

(21) Appl. No.: 10/756,709

(22) Filed: Jan. 13, 2004

(65) Prior Publication Data
US 2005/0134292 A1 Jun. 23, 2005

(51) Int. Cl.$^7$ .............. G01R 27/26; G01L 9/12
(52) U.S. Cl. ............. 324/658; 324/678; 73/724
(58) Field of Search ............... 324/658–689, 324/649, 600, 382, 519, 548, 76.66; 340/870.37; 73/74, 718, 724, 780, 335.04, 514.32, 862.22, 73/862.337, 862.52, 862.626

(56) References Cited

U.S. PATENT DOCUMENTS

| | | | | |
|---|---|---|---|---|
| 4,977,480 A | * | 12/1990 | Nishihara ............... 361/283.4 |
| 5,006,952 A | | 4/1991 | Thomas .................... 361/283 |
| 5,343,766 A | * | 9/1994 | Lee ......................... 73/862.61 |
| 5,374,787 A | | 12/1994 | Miller et al. ............... 178/18 |
| 5,744,968 A | * | 4/1998 | Czarnocki et al. ......... 324/608 |
| 5,790,107 A | | 8/1998 | Kasser et al. .............. 345/174 |
| 5,910,781 A | * | 6/1999 | Kawamoto et al. ...... 340/870.37 |
| 6,196,067 B1 | * | 3/2001 | Martin et al. ............ 73/514.32 |
| 6,356,085 B1 | * | 3/2002 | Ryat et al. ................. 324/658 |
| 6,366,099 B1 | * | 4/2002 | Reddi ....................... 324/678 |
| 6,377,056 B1 | * | 4/2002 | Hanzawa et al. .......... 324/678 |
| 6,438,257 B1 | * | 8/2002 | Morimura et al. ......... 382/124 |
| 6,529,015 B2 | * | 3/2003 | Nonoyama et al. ........ 324/678 |
| 6,720,777 B2 | * | 4/2004 | Wang ....................... 324/680 |

FOREIGN PATENT DOCUMENTS

| | | | |
|---|---|---|---|
| DE | 19753682 A1 | 12/1997 | ........... G01D 5/24 |
| WO | WO 01/31351 A1 | 5/2001 | ........... G01R 27/26 |
| WO | WO 03/071230 A2 | 8/2003 | ........... G01D 5/00 |

* cited by examiner

Primary Examiner—Vincent Q. Nguyen
Assistant Examiner—Hoai-An D. Nguyen
(74) Attorney, Agent, or Firm—George O. Saile; Stephen B. Ackerman

(57) ABSTRACT

A circuit and method are given, which realizes a stable yet sensitive differential capacitance measuring device with good RF-suppression and with very acceptable noise features for use in capacitive sensor evaluation systems. By evaluating the difference of capacitor values only—with the help of a switched capacitor front-end—large spreads of transducer capacitor values are tolerable. Furthermore a mode of operation can be set up, where no essential galvanic connection between sensor input and the active read-out input at any given time is existing. The solution found exhibits a highly symmetrical construction. Using the intrinsic advantages of that solution the circuit of the invention is manufactured as an integrated circuit with standard CMOS technology at low cost.

50 Claims, 21 Drawing Sheets

DIFFERENTIAL CAPACITANCE MEASUREMENT

BACKGROUND OF THE INVENTION (1) Field of the Invention

The invention relates generally to electronic circuits for the evaluation of the physical effects on capacitive components and more particularly, to circuits for detecting capacitance variations at capacitive sensors or transducers and even more particularly to a circuit for the detection of the x-, y- and z-coordinate position changes measured with displacement-responsive devices such as joysticks built with variable capacitors. Both, a circuit and a method are disclosed.

(2) Description of the Prior Art

Many electronic sensing devices on the market today are built by eploiting capacitive effects by some means or other. Amongst them there are devices for touch or actuator buttons e.g. implementing a non-mechanical switch as used for example in elevator control panels or vandal-proof telephone dialers. Further on high reliability switches for keyboards are manufactured with such capacitive contacts normally used in computer systems or any other industrial equipment e.g. tooling machinery, but also in control devices for commercial and consumer products e.g. television sets or video recorders. In general any proximity sensors using the change of the dielectric constant of a dedicated capacitor element fall into that category, e.g. changed by a nearing body such as a hand or finger. Sensors for detecting humidity or even measuring moisture are also using that principle. Numerous devices are available or have been proposed for use as object position detectors for use with computerized systems and other applications equally based on capacitive change measurements. Maybe the most important applications are however found in the field of non-contact displacement measurements as adopted in capacitive displacement transducers, which are known for use in displacement-responsive devices such as measurement probes and joysticks, where a stylus or lever is movable in the directions of two or more orthogonal axes and thus altering the values of the correspondent capacitors in its base. These devices become even more important in the future as electronic control and steering is further finding its way into terrestrial, maritime and airborne vehicles of any kind, where joystick solutions are willingly adopted. Normally there would be one or more separate capacitive transducers for each axis of movement. Each such transducer comprises at least a pair of capacitor plates which are relatively movable. In some known devices there are three or more capacitor plates in each transducer, so that the transducer comprises a differential pair of capacitors. Such an ingenious arrangement has improved performance compared to single capacitor solutions. The needed electronic evaluation circuits however turn out to be rather complicated and have to be cleverly devised.

While such high reliability and high stability devices—also used in the implementation of this invention—offer promise in certain sophisticated applications, price performance issues continue to limit their desirability. Further, many prior art devices use elaborate analog signal processing for a substantial portion of the circuitry, which imposes further drawbacks.

There has therefore been a need for a capacitive sensing device which performs sensing simply, inexpensively and rapidly, while at the same time avoiding problems with temperature, moisture and pressure variation. There has also been a need for such a sensing device which facilitates conversion to digital processing as quickly as possible, as well as permitting a higher degree of integration than has previously been possible.

It is therefore a challenge for the designer of such methods and circuits to achieve a high-quality and low-cost solution. Several prior art inventions referring to such solutions describe related technologies, methods and circuits.

U.S. Pat. No. 5,790,107 (to Kasser et al.) describes a method and an apparatus for determining small variations in capacitance, typically in a capacitive touch sensing device, including a reference signal of a first frequency and a sample signal of a second frequency. The reference and sample signals are mixed and filtered to isolate the beat frequency therebetween, which is then measured to provide an indication of the variation in the sample frequency. The measurement can then be manipulated by a microprocessor or microcontroller to provide desired control signals. The apparatus is susceptible of digital implementation and single chip implementation.

U.S. Pat. No. 5,374,787 (to Miller et al.) discloses a proximity sensor system including a sensor matrix array having a characteristic capacitance on horizontal and vertical conductors connected to sensor pads. The capacitance changes as a function of the proximity of an object or objects to the sensor matrix. The change in capacitance of each node in both the X and Y directions of the matrix due to the approach of an object is converted to a set of voltages in the X and Y directions. These voltages are processed by analog circuitry to develop electrical signals representative of the centroid of the profile of the object, i.e., its position in the X and Y dimensions. The profile of position may also be integrated to provide Z-axis (pressure) information.

U.S. Pat. No. 5,006,952 (to Thomas) shows a signal conditioning circuit for multiple channel capacitive displacement transducers. The transducer comprises three differential capacitive transducers, driven by respective square waves from modulators. The modulators are driven at different frequencies which are even multiples of each other, derived from a divider. The signals from each differential capacitance pair of the transducer are received by a common charge amplifier. They are then demodulated by respective phase sensitive rectifiers, each of which is driven at the same frequency as the corresponding modulator. The outputs of the phase sensitive rectifiers are integrated, e.g. by circuits for one of the channels, and the resulting voltage signal is fed back to the corresponding modulator so as to tend to null the input to the charge amplifier. The use of modulating frequencies which are even multiples of each other enables the signals to be multiplexed through a single charge amplifier. The mechanical construction of the multi-channel transducer is also described.

Although these patents describe circuits and methods close to the field of the invention they differ in essential features from the method and especially the circuit introduced here.

SUMMARY OF THE INVENTION

A principal object of the present invention is to provide an effective method implementable with the help of very manufacturable integrated circuits for an evaluation circuit for very sensitive capacitive transducers.

A main object of the present invention is thereby to establish an especially adapted method for a precise, sensitive and yet stable evalution of small capacitive changes or variations.

Another object of the present invention is to increase sensitivity by using a differential capacitor arrangement.

Another object of the present invention is to show an implementation, which is in a great measure insensitive to electric and magnetic interfering stray fields.

Further an object of the invention is to present a circuit, where an external electrical charge injection is automatically compensated for, basically by its largely symmetrical construction of the essential electromagnetic and charge sensitive components.

Also another object of the invention is to ensure that at any time given there is no essential galvanic connection between the input terminals and internal active components.

Further on another object of the invention is to exploit this symmetrical arrangement in order to effectively suppress the influence of noise onto the results of the measurements.

Still another object of the invention is to avoid time consuming and costly alignment and component matching steps during manufacture.

Also an object of this invention is to reduce the necessary number of high precision electronic components of great stability within the implementation of the evaluation circuit.

A still further object of the present invention is to allow for an implementation with modern digital components by use of the appropriate design features of said method.

Equally an object of this invention is to reduce the necessary contingent of analog parts in the circuit, especially avoiding active amplifiers at the sensing front end.

Also an object of the invention is to reach a good radio frequency suppression of the device, eventually gaining even more importance as wireless solutions for communication purposes are used much more frequently nowadays.

A still further object of the present invention is to reduce the power consumption of the circuit by realizing inherent appropriate design features.

Another further object of the present invention is to reduce the cost of manufacturing by implementing the circuit as a monolithic integrated circuit in low cost CMOS technology.

Another still further object of the present invention is to reduce cost by effectively minimizing the number of expensive components and fabrication steps.

In accordance with the objects of this invention, a circuit implementing a new method for differential capacitance measurements is achieved, capable of evaluating small capacitance variations within a differential capacitor arrangement forming a transducer and thus apt for real-time evaluating and measuring such differential capacitive transducers with high sensitivity and great noise immunity, implemented e.g. as a pair of sensor capacitors, connected normally to the two input terminals of said circuit and delivering a precise and stable output signal as result of said measurement to its output terminals. Said circuit comprises capacitive sensor elements or transducers in form of capacitors, connected to input terminals of some evaluation means and designated as transducer capacitors. The circuit is further comprising: means for evaluating said small variations in magnitude of capacitance in real-time and thus measuring said capacitive sensor elements, delivering output signals as result of said measurement and consisting of some means for charging and discharging said transducer capacitors with charges delivered by appropriate supply voltages, some means for transferring and exchanging said charges implemented in form of a switching network, and some means for transforming said transferred and applicatively exchanged charges into voltages equivalent to said output signals implemented within some read-out system; means for internal intermediate storage of electrical energy, assembled as a four-pole (two-port) circuit exhibiting two input and two output terminals; and amplifier stages connected to said output terminals of said means for internal intermediate storage of electrical energy, delivering a boosted output signal at the output terminals of the circuit.

Also in accordance with the objects of this invention, a new general method for differential capacitance measurements, capable of evaluating small capacitance variations within a differential capacitor arrangement forming a transducer and thus apt for real-time evaluation and measurement of said differential capacitive transducers with high sensitivity and great noise immunity. Such a method consists of steps for providing the necessary means, steps for making things available and preparing them, steps for establishing auxiliary measures and determining their use, steps for executing and also restarting appropriate procedures and finally steps for conditioning the results. Said method is therefore comprising: providing a sensor element with—in general—two variable transducer capacitors configured as a differential capacitor for an evaluation by the following measurement procedure; providing a means for a real-time evaluation of the operational variations of said transducer capacitor values in form of a switched capacitor (SC) front-end deploying two input terminals for connecting said transducer capacitors and two output terminals for delivering an appropriate output signal as result of the evaluation measurement; providing appropriate supply voltages for said means; providing—within said SC front-end—as switched charge exchange network a general switching circuit part for generating charges, charge transfer and charge exchange; providing a means for the post processing of said output signal in form of amplifier stages for level and reference conversion, buffering and boosting of said output signal; making available—within said SC front-end—said appropriate supply voltages for charging each of said transducer capacitors with the help of two appropriate pairs of switches belonging to said switched charge exchange network; making available—within said SC front-end—a pair of internal storage capacitors together with two appropriate pairs of switches—also belonging to said switched charge exchange network—for transport of charges from said transducer capacitors to said internal storage capacitors; making available—within said SC front-end—a read-out system with input and output terminals—which, together with two optionally and appropriately used switches is capable of interpreting said stored charge on said internal storage capacitors thus preparing the delivery of said output signal as result of said evaluation measurement; establishing a periodic timing schedule (consisting of multiple e.g. three separate time segments each again separable in some number of time slots) for the pertinent operation of the switches within said SC front-end for said charging of said transducer capacitors—e.g. in time segment I—, for said charge transport from said transducer capacitors to said read-out system—e.g. in time segment II—and for said delivery and said interpreting of said output signal—e.g. in time segment III; determining for said SC front-end the charging and discharging of both of said transducer capacitors by means of two pairs of switches with regard to said appropriate corresponding supply voltages; determining within said SC front-end the transport of charges from both of said transducer capacitors to said separate and respective internal storage capacitors by means of two pairs of switches; determining within said SC front-end the transport of charges from both of said internal storage capacitors to said input terminals of said read-out system by some means, thus establishing an input voltage for said read-out system; determining within said read-out system the conversion of said input voltage at said input terminals into an output voltage at said output terminals by some means, thus producing said output voltage for said SC front-end; executing the charging of the first of said transducer capacitors and the discharging of the second of said transducer capacitors by means of the first pair of said switches with regard to said appropriate corresponding supply voltages e.g. during a slot in time segment I; executing the transport of charges from both of said transducer capacitors to the first of said separate internal storage capacitors by means of the first pair of said switches e.g. during a slot in time segment I; executing the discharging of the first of said transducer capacitors and the charging of the second of said transducer capacitors by means of the second pair of said switches with regard to said appropriate corresponding supply voltages e.g. during a slot in time segment II; executing the transport of charges from both of said transducer capacitors to the second of said separate internal storage capacitors by means of the second pair of said switches e.g. during a slot in time segment II; restarting optionally the execution of the timing schedule from the beginning i.e. with the first step of executions within segment I and repeating the according processing steps e.g. during time segments I and II continuously until a terminating condition is reached; executing the transport of charges from both of said internal storage capacitors to said input terminals of said read-out system by some means, thus establishing an input voltage for said read-out system e.g. during time segment III; executing within said read-out system the conversion of said input voltage at said input terminals into an output voltage at said output terminals by some means, thus producing said output voltage for said SC front-end e.g. during time segment III, and thus furnishing a floating output voltage signal as said result of said evaluation measurement; restarting the execution of the timing schedule from the beginning i.e. with the first step of executions within segment I and repeating the according processing steps e.g. during time segments I, II and III continuously; conditioning said floating output voltage signal as said result of said evaluation measurement at said output terminals continuously by amplifying the difference of said floating voltages within a first amplifier stage of said amplifier stages for said level and reference conversion; and conditioning further on the output voltage signal of said first amplifier stage of said amplifier stages for said buffering and boosting of said output signal continuously in a second single ended amplifier stage thus resulting in a final gain adjusted strong output signal of said difference capacitance measurement.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit arrangement and a new method for differential capacitance measurements, capable of a very sensitive evaluation of small capacitance varaiations within a differential capacitor arrangement. These variations are evaluated in devices for touch or actuator buttons e.g. for implementing non-mechanical switches as used for example in elevator control panels or vandal-proof telephone dialers, said principle is further used for building high reliability switches for keyboards with capacitive contacts in computer systems or any other industrial equipment e.g. for tooling machinery, but also in control devices for commercial and consumer products e.g. television sets or video recorders. Capacitance variations are analyzed also within proximity sensors using the change of the dielectric constant of a dedicated capacitor element. Sensors for detecting humidity or even measuring moisture also use the evaluation of small changes within a differential capacitor component. Many object position detectors are based on said principle of capacitive, non-contact displacement measurements as adopted in transducers for use in displacement-responsive devices such as measurement probes and especially important, joysticks.

The description of the preferred embodiments of the invention is presented here as an overall description of one exemplary implementation both with a circuit schematic and with its underlying method.

Figure 1:
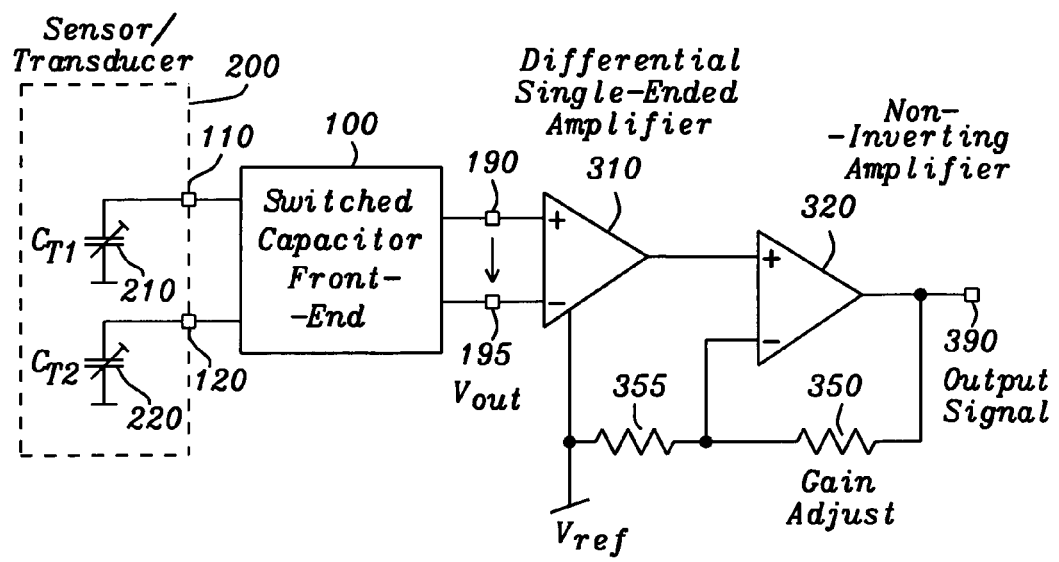
FIG. 1 illustrates the building blocks for the preferred embodiment of the present invention i.e. an enriched block diagram of the differential capacitive change evaluation and measurement system is given. The block diagram shows the essential circuit blocks such as a Switched-Capacitor Front-End block and operational signal Amplifiers, all realizable with a variety of modern monolithic integrated-circuit technologies. This circuit may be used then, for example, as evalution circuit for the measuring of one coordinate (x, y or z) of an object in three-dimensional space.

Referring now to the block diagram in FIG. 1, the preferred embodiment of the circuit implementing the method of the present invention is illustrated. The essential functional blocks are a Sensor element or Transducer 200, the Switched Capacitor Front-End block 100, a Differential Single-Ended Amplifier 310 with immediately following Non-inverting Amplifier 320 for delivering a strong Output Signal 390. The transducer or sensor element is made up of two variable capacitors $C_{T1}$ (item 210) and $C_{T2}$ (item 220) together forming a differential capacitor, whereby each capacitor $C_{T1}$ and $C_{T2}$ is with its 'hot' side connected correspondingly to the two input terminals 110 and 120 of the evaluation circuit; input terminals to the Switched Capacitor Front-End block 100. The other sides of said transducer capacitors are both connected to virtual ground of the circuit, therefore the capacitor electrode for these sides can be realized as common plate of a true differential capacitor component. The two output terminals 190 and 195—floating with respect to ground—of said Switched Capacitor Front-End block 100 carry the floating output signal $V_{out}$, the value of which can be of positive or negative sign and which is fed into an operational amplifier 310 with differential inputs, preferably with high common mode rejection ratio, high gain and low noise—possibly additionally enhanced with band-limiting and properly adjusted elements. The single-ended output signal of said differential amplifier 310 is in turn fed into the input of a buffering amplifier, here implemented as a non-inverting operational amplifier with resistive feedback, made up of a voltage divider with two resistors (350 and 355) for gain adjustment and connected to an intrinsic reference voltage $V_{ref}$, thus delivering a boosted output signal at terminal 390. It should be noted, that for proper floating operation of these amplifiers the supply voltages have to be chosen accordingly, i.e. symmetrical with respect to virtual ground of the circuit.

Figure 2:
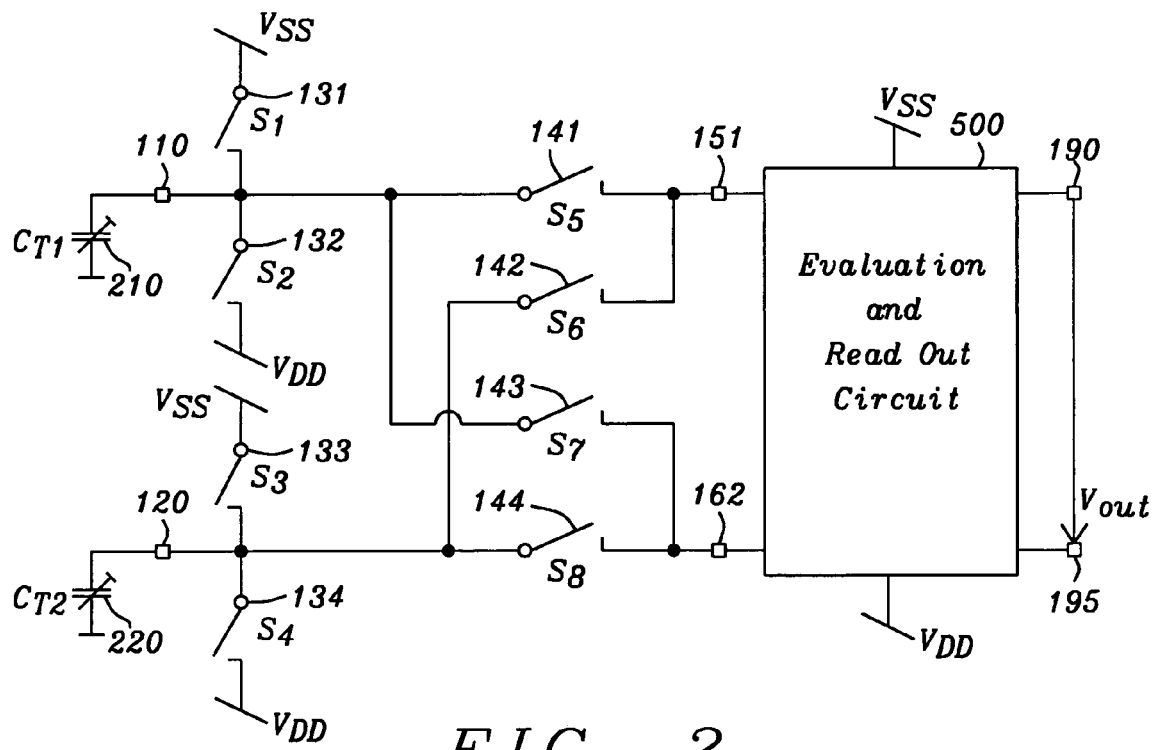
FIG. 2 shows in form of a combined circuit and block diagram an implementation proposal for the sensor input stage—also called X-change (exchange) Network—in connection with a general Evaluation and Read-Out Circuit block, emphasizing the high flexibility of the concept of the invention at this point.

In FIG. 2 the essential input part of the aforementioned Switched Capacitor Front-End block 100 is arranged using a first switching stage—built with the switches $S_1 \ldots S_4$ (items 131 ... 134)—for the time controlled charging and discharging of the sensor capacitor assembly $C_{T1}$ and $C_{T2}$, generated with the help of the two supply voltages $V_{SS}$ and $V_{DD}$. These switch charged capacitors can then be understood as nothing else, than a voltage source with a high output impedance. This stage is followed by a second switching stage—built with the switches $S_5 \ldots S_8$ (items 141 ... 144)—now used for the time scheduled transfer of the resulting charges from said sensor capacitor assembly $C_{T1}$ and $C_{T2}$ into the shown Evaluation and Read-Out Circuit Block (item 500) via its input terminals (items 151 and 162), supplied also by said supply voltages $V_{SS}$ and $V_{DD}$. An essential and important feature of the invention is hereby the alternating sign inversion of two successional charge packages, generated and transferred in their appropriate time segments and time slots. For the sake of brevity this circuit part comprising of the two stages of switches made up of the the switches $S_1 \ldots S_4$ in said first stage (items 131 ... 134) and the switches $S_5 \ldots S_8$ in said second stage (items 141 ... 144) in a configuration of switches reminding of and symbolically resembling the letter X shall be called the X-Change Network. This designation may also be understood as a paraphrase for the charge exchange operation, effected by the X-configuration of switches. The very flexible and adaptable principle of time segmentation and time slotting will be more precisely described in the following. Time slotting is called here the use of shorter entities of the basic switching sequences, which may be repeated several times within the time frame of a certain segment, thus allowing for a greater flexibiltiy in the flow of switching and achieving additional effects thus as smoothing and averaging, noise reduction etc. of the input signals. The general Evaluation and Read-Out Circuit Block 500 delivers the C) resulting output voltage $V_{out}$ at two output terminals (items 190 and 195). Circuit descriptions of several implementations for this Evaluation and Read-Out Circuit Block (D 500 will also be given later.

Figure 3:
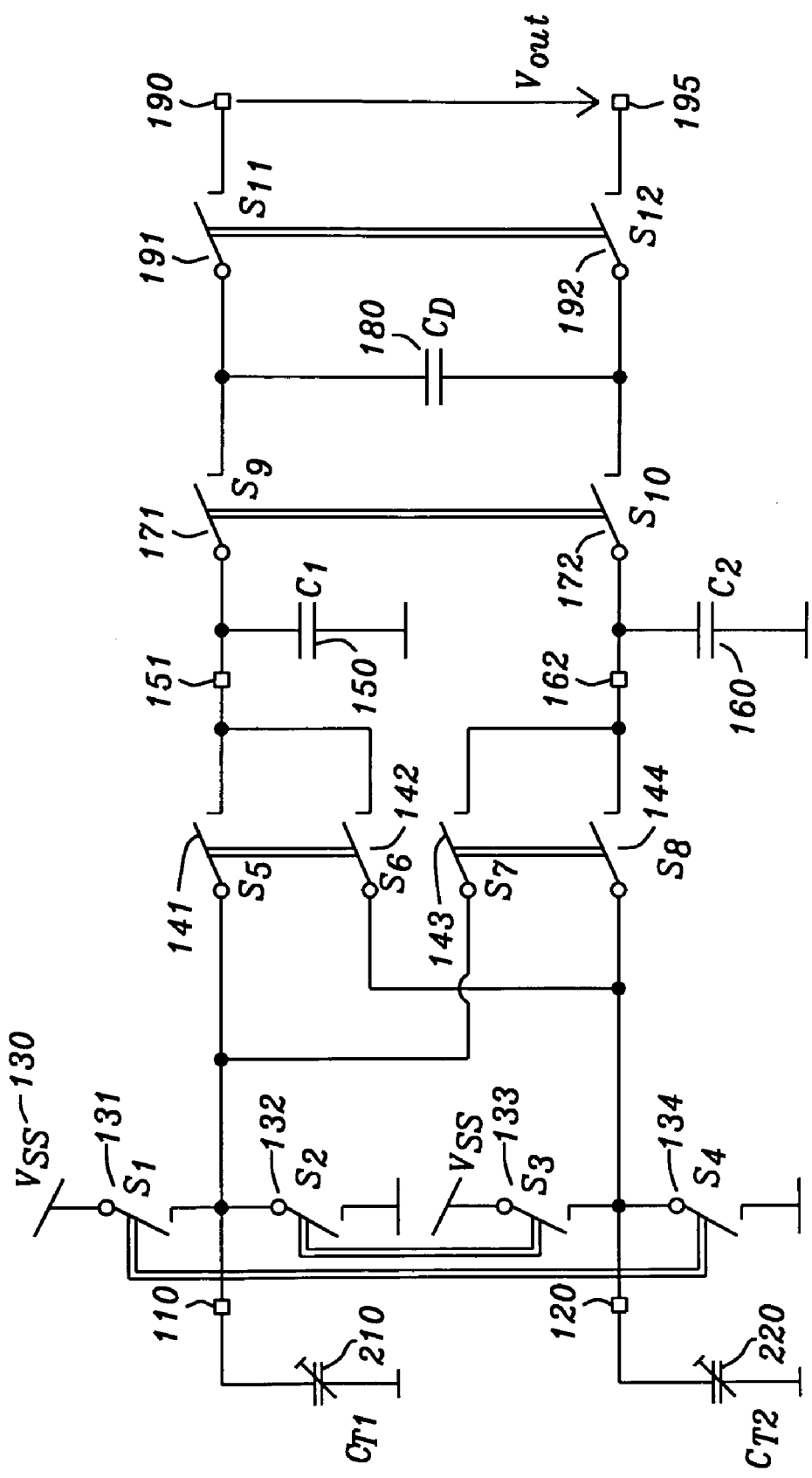
FIG. 3 shows in form of a symbolic circuit diagram an implementation of the differential capacitor sensors and the according evaluation circuit—in principle an operating part consisting only of passive components as represented by said Switched Capacitor Front-End block in FIG. 1.

Continuing with the circuit schematics of FIG. 3, a more elaborate representation of the differential capacitor sensors $C_{T1}$ and $C_{T2}$ (210 and 220) section with an exemplary implementation of the according evaluation circuit 100 of FIG. 1 is drawn, whereby the contents of the Switched Capacitor Front-End block 100 in FIG. 1 is depicted in greater circuit details with the help of a symbolic circuit diagram. This is called symbolic in view of the hardware switch symbols shown, whereas these switches are in the integrated circuit implementations later on replaced by standard transmission gates as realized with field effect transistors (FETs) for instance. Thus this part of the system is mainly consisting only of passive components particularly with regard to said basic sensor evaluation function. It can be understood as a medium between a switched capacitor (SC) network—as known from integrated filter design—and charge pumps—as known from voltage converter and power supply devices. In FIG. 3 said two variable transducer capacitors $C_{T1}$ (item 210) and $C_{T2}$ (item 220), which together form said differential capacitor are shown, connected to their respective input terminals 110 and 120 of the SC front-end 100, as already refered to above (see also FIG. 1). The circuit of the SC front-end is essentially constructed in such a way, that the varying electrical sensor charges from said transducer capacitors $C_{T1}$ and $C_{T2}$ are sequentially transported via two intermediate storage capacitors $C_1$ (item 150) and $C_2$ (item 160) onto a 'difference' capacitor $C_D$ (item 180) summing up the two charges from $C_{T1}$ and $C_2$. The output voltage signal $V_{out}$ at terminals 190 and 195 is then established as outcome of this summed-up difference charges from $C_1$ and $C_2$, now residing on capacitor CD. The means for generating the initial charges on said transducer capacitors $C_{T1}$, and $C_{T2}$ are voltage $V_{SS}$ 130 and the two pairs of switches $S_1$, $S_4$ (items 131, 134) and $S_2$, $S_3$ (items 132, 133). The transport of the charges from $C_{T1}$ or $C_{T2}$ to $C_1$ or $C_2$ is accomplished with the help of two pairs of switches $S_5$, $S_6$ (items 141, 142) or $S_7$, $S_8$ (items 143, 144). Once arrived on $C_1$ and $C_2$ via the terminal points 151 and 162 shown apart respectively—the input terminals of the Evaluation and Read-Out Circuit Block 500 of FIG. 2—the charges are summed up with the help of another pair of switches $S_9$ and $S_{10}$ (items 171 and 172) on said 'difference' capacitor CD. From there the appearing voltage $V_{out}$, measured over said 'difference' capacitor CD is switched through—via a last pair of switches $S_{11}$ and $S_{12}$ (items 191 and 192)- to the output terminals 190 and 195 as floating output signal $V_{out}$. The circuit schematics are depicting all these pairs of switches with a pairing identification applied as double lines for the coupling between said pairs. In order to fully understand the charge generating and transport mechanism as well as the output voltage appearance effect and output signal transfer issue further explanations with respect to the succession of events in time are necessary. It should be noted here however, that the complete evaluation procedure has to be accomplished in real-time, i.e. specifications for the SC front-end processing, as well as demands and restrictions with respect to its dynamic behavior have to be observed. Such sensors—as used here for a position determination—normally have a response time (tr) of about 3.5 ms; (with tr*bw=0.32 . . . 0.45 as mostly and empirically adopted) corresponding to a bandwidth (bw) of 100 Hz. When the capacitor switching is clocked with e.g. 100 kHz, for both the capacitor pairs $C_{T1}$, $C_{T2}$ and $C_1$, $C_2$ an effective oversampling (by a factor of 1000) is introduced and therefore we get all the advantages from such a technique, as e.g. a noise reduction by averaging; which also means, that after some clock ticks the circuit is settled to its steady state. As already explained above, the switch charged capacitors $C_{T1}$, $C_{T2}$ can then be understood as a voltage source with a high output impedance. The switched pair of capacitors $C_1$, $C_2$ thus serves as a first low-pass filter stage driven by that source.

Now considering FIGS. 4A to 4F the aforementioned generation of charge on the two transducer capacitors $C_{T1}$ and $C_{T2}$ is visualized as well as the transport mechanism from $C_{T1}$ and $C_{T2}$ to said two intermediate storage capacitors $C_1$ and $C_2$ and from there the charge summing on said 'difference' capacitor CD. Together with said output voltage appearance effect over said 'difference' capacitor CD generating $V_{out}$ said output signal transfer issue establishing finally the resulting floating output signal $V_{out}$ is illustrated and explained. This chronology of events within said switched capacitor front-end with all its different operating steps can only be properly understood in conjunction with said time diagram for the sequential operation of all the switches $S_1$ to $S_{12}$ as given in FIG. 5. As a general preliminary remark shall be noted, that the timing of the switching impulses for the pairs of switches relative to each other and taken as absolute duration values is not very critical but that absolutely no overlapping of impulses is allowed to ever occur.

Figure 5A:
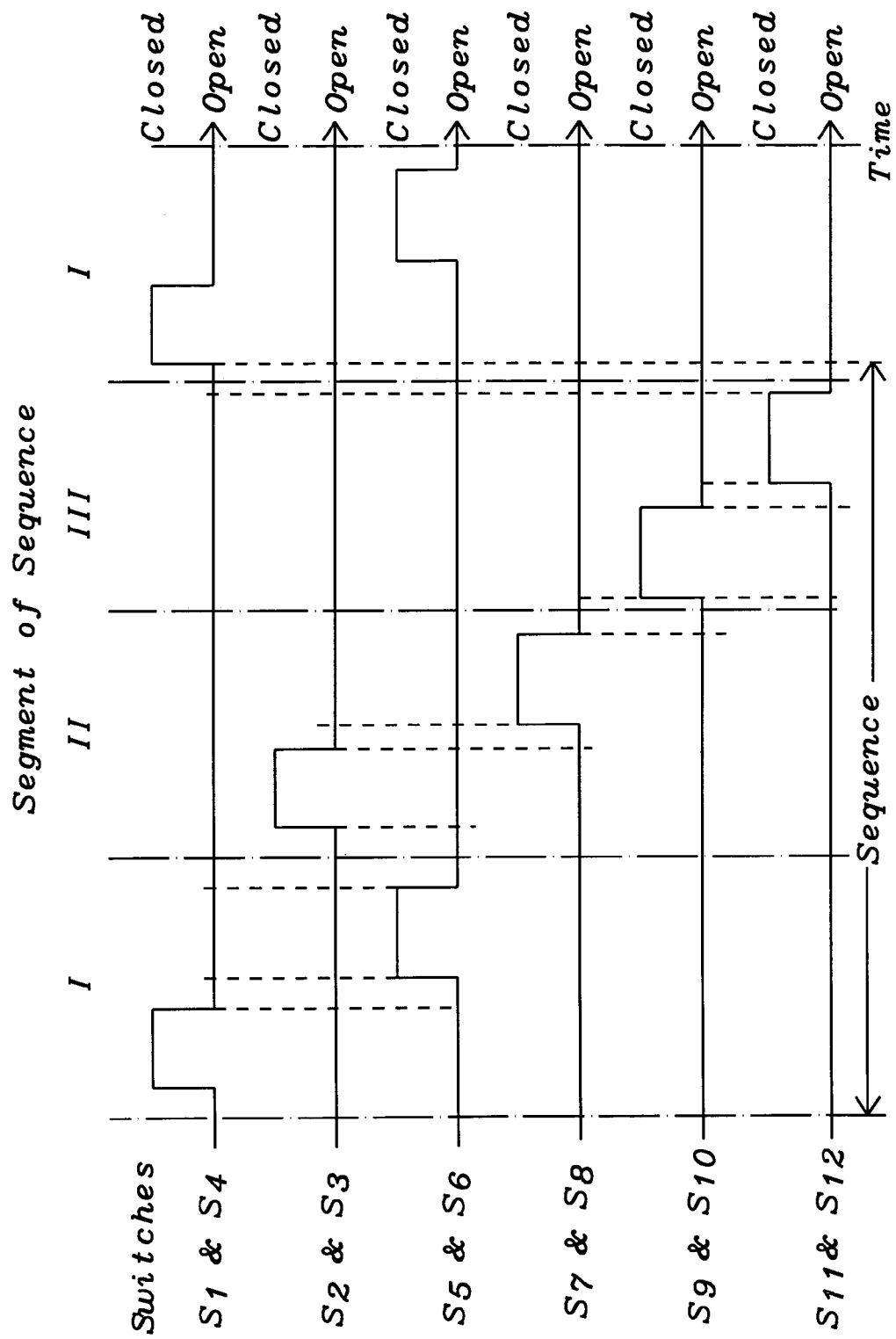
FIG. 5A shows in form of a time diagram an example for the sequential operation of the switches used in the circuit of said Switched Capacitor Front-End of FIG. 3 and explained by its different operating steps depicted in FIGS. 4A to 4F.

FIG. 5A displays the operation of the pairs of switches already described above with the help of a timing diagram, showing in one steadily and continuously repeated sequence—comprising of three distinct segments, named I, II and III—the status of each switch as Closed or Open.

Figure 4A:
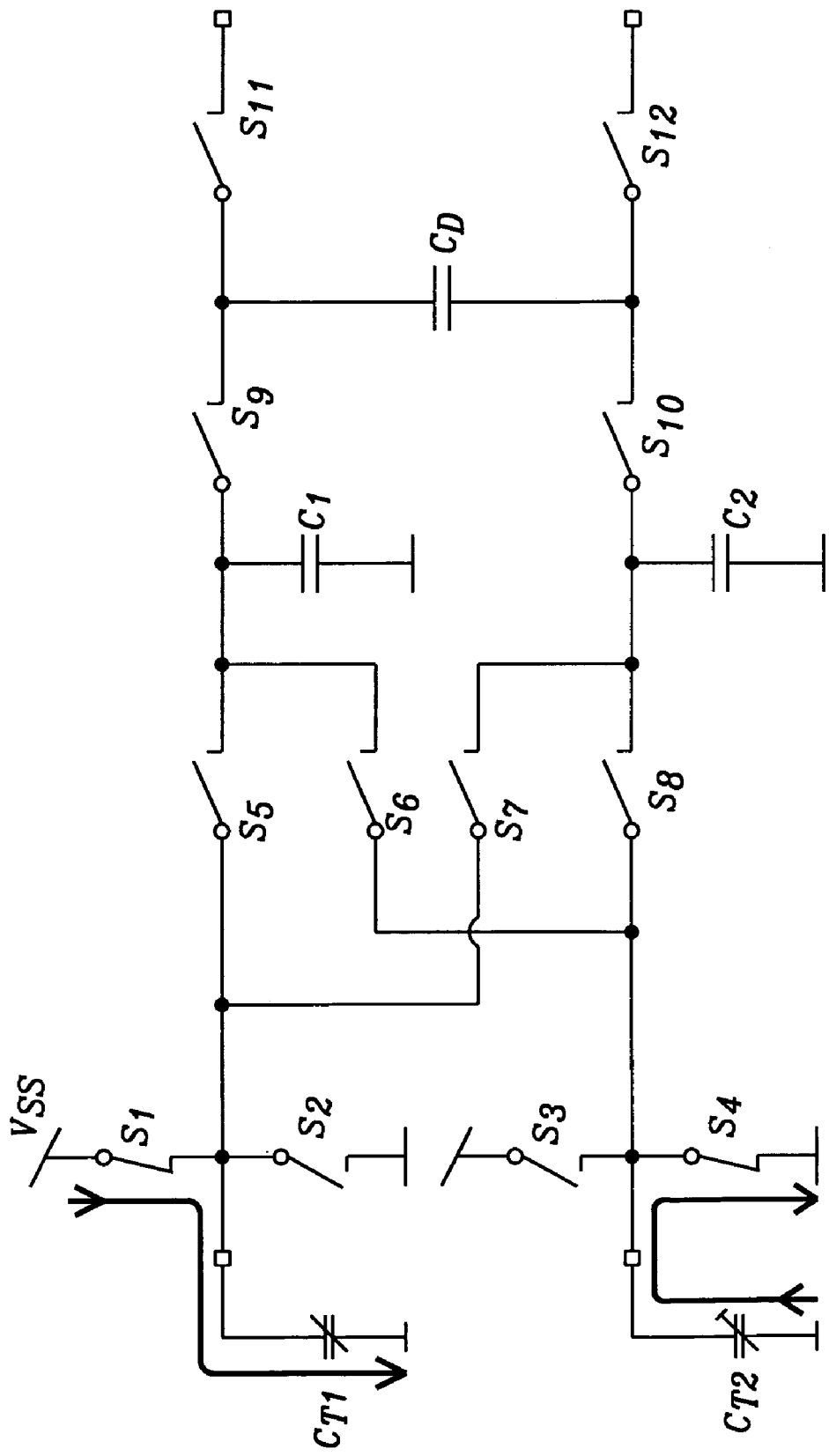
FIG. 4A to FIG. 4F show the different operating steps chronology within said Switched Capacitor Front-End of FIG. 3 in order to thoroughly explain its functioning.
Figure 4B:
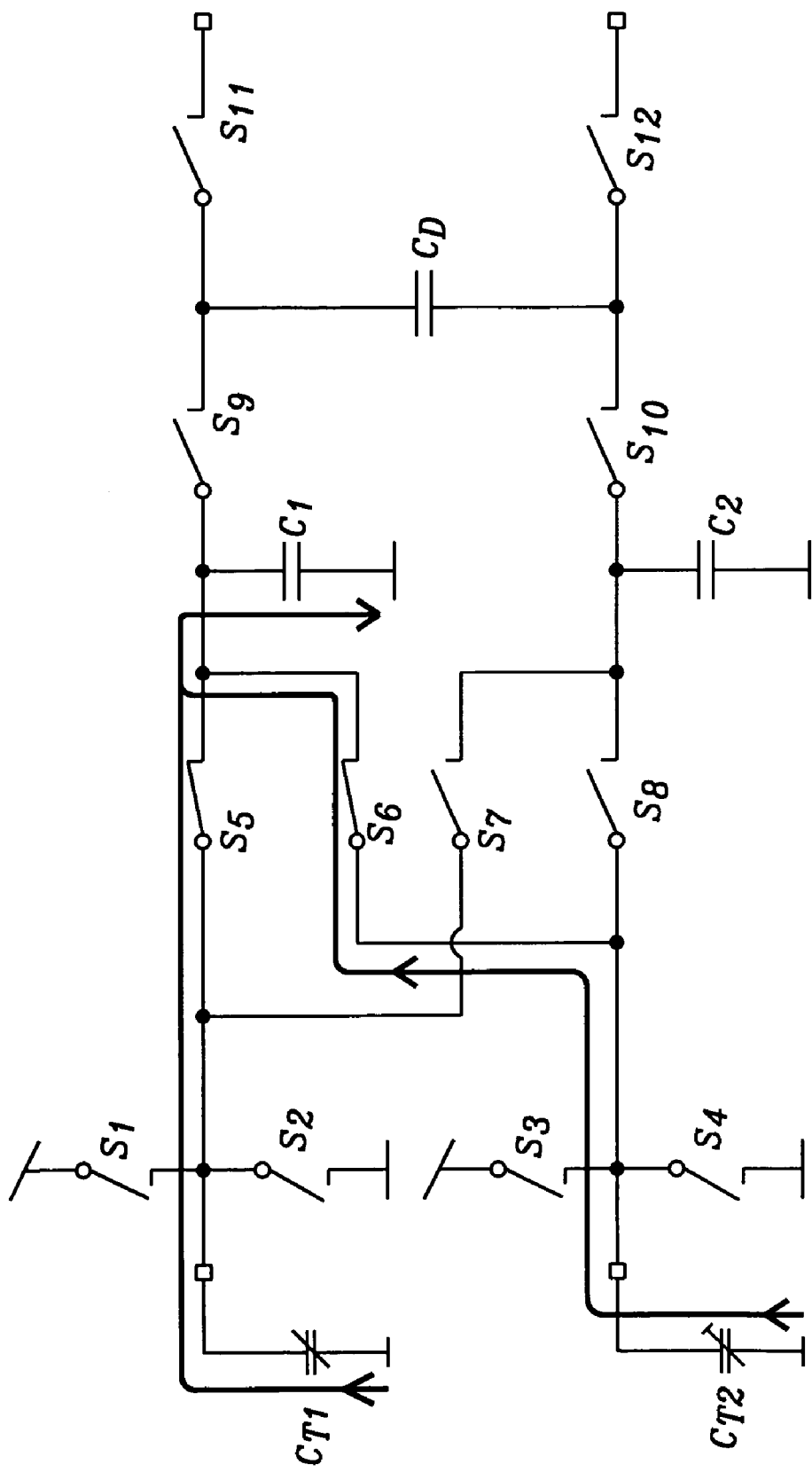
Figure 4C:
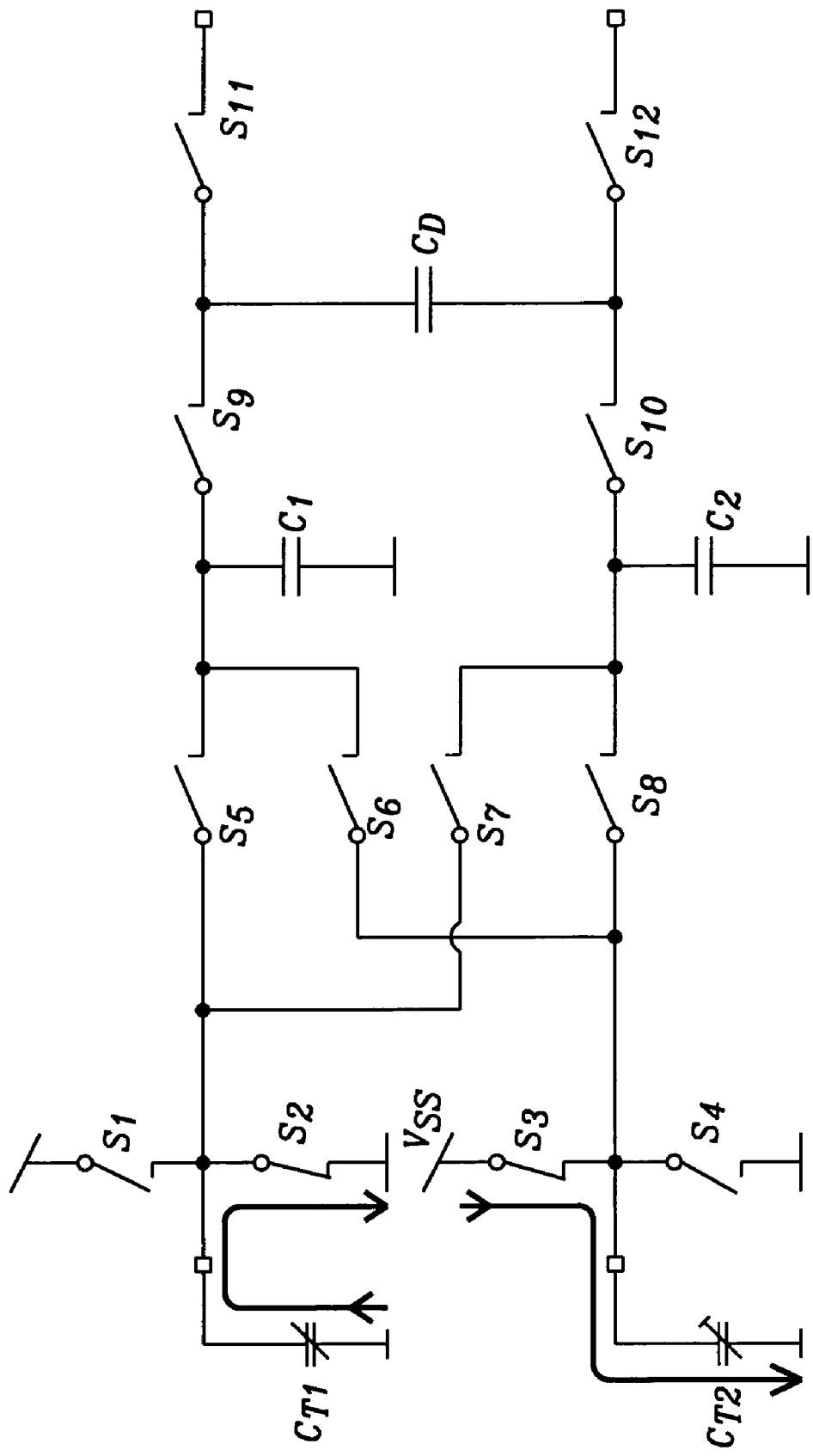
Figure 4D:
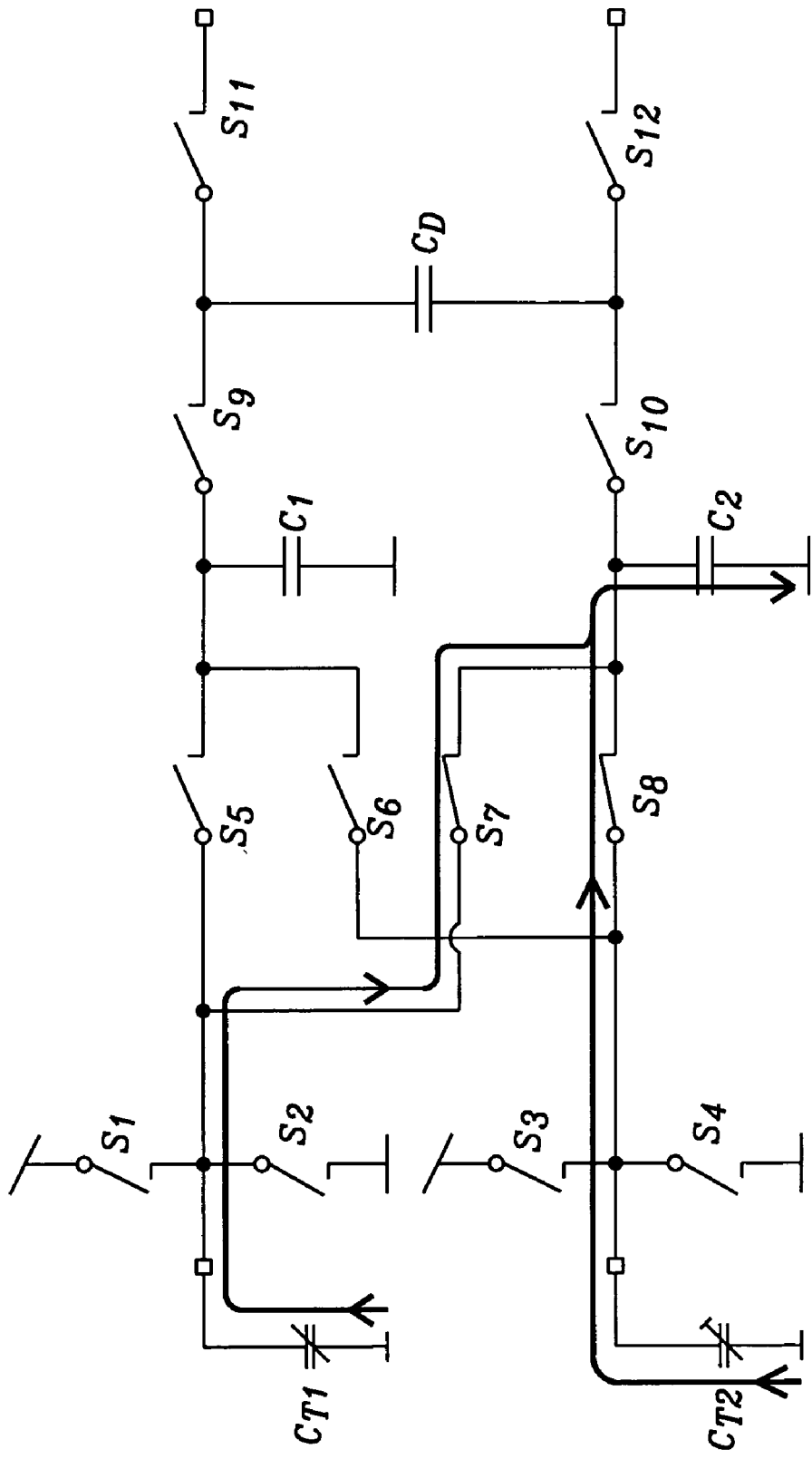
Figure 4E:
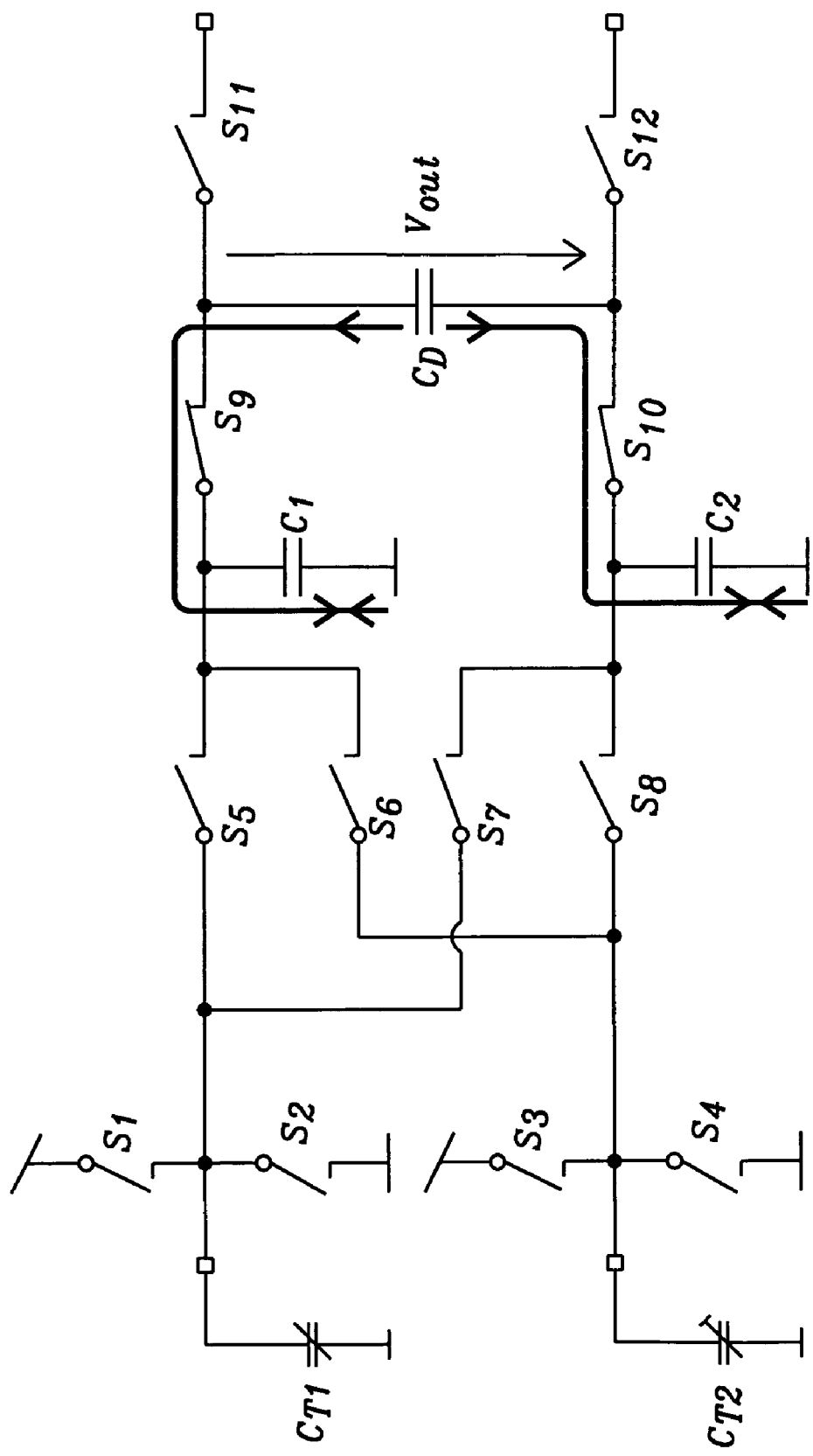
Figure 4F:
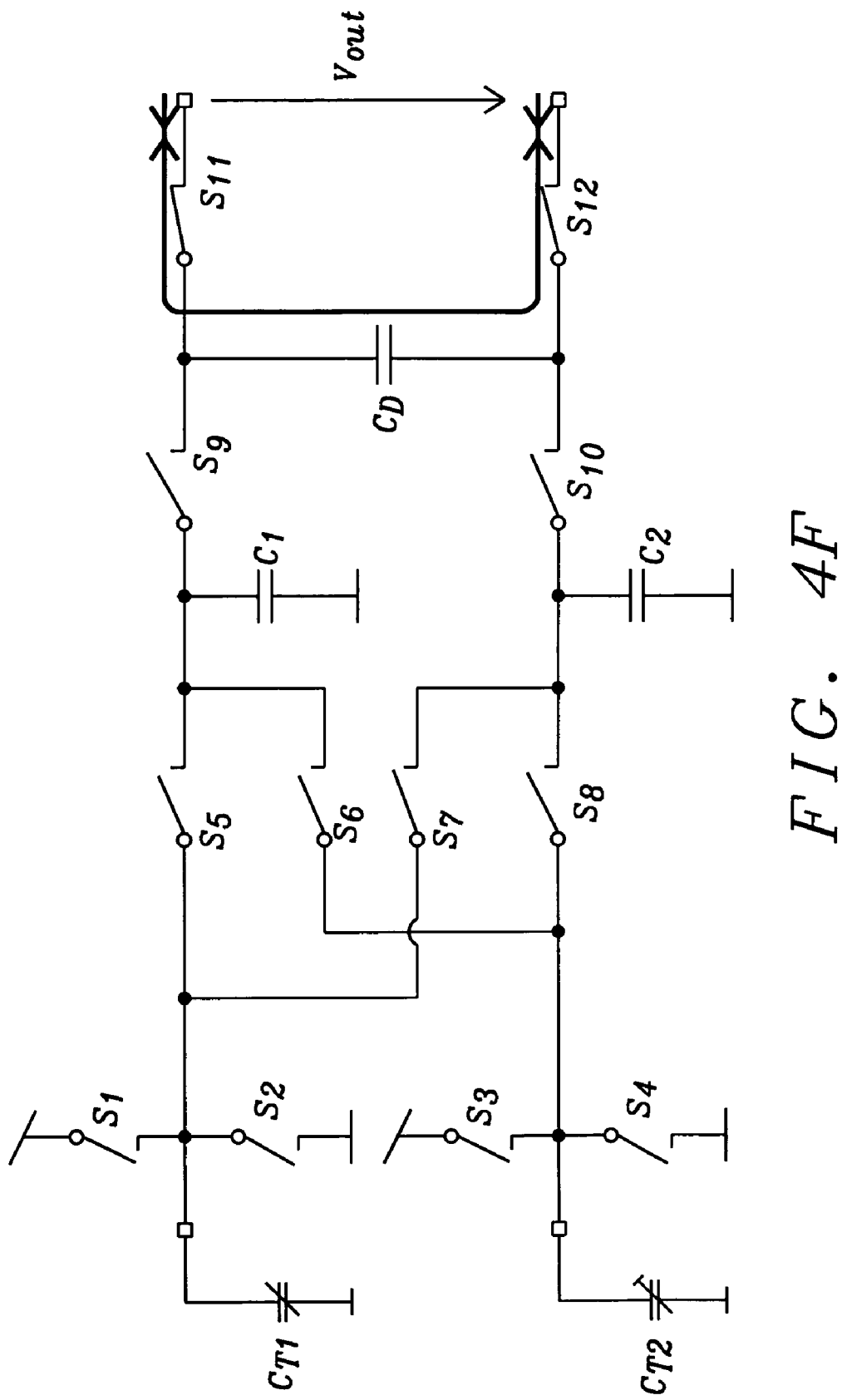

Segment I operating only on the two switches or pair of switches $S_1$, $S_4$—charging the transducer capacitor $C_{T1}$ with the help of voltage $V_{SS}$ and discharging $C_{T2}$ (see FIG. 4A)—and $S_5$, $S_6$—transporting the difference of charges from $C_{T1}$ and $C_{T2}$ to said intermediate storage capacitor $C_1$ (see FIG. 4B). Segment II operating only on the pair of switches $S_2$, $S_3$— charging the transducer capacitor $C_{T2}$ with the help of voltage $V_{SS}$ and discharging $C_{T1}$ (see FIG. 4C)— and $S_7$, $S_8$—now transporting the difference of charges from $C_{T1}$ and $C_{T2}$ to said intermediate storage capacitor $C_2$ (see FIG. 4D). Segment III finally operating on the pair of switches $S_9$, $S_{10}$—where the charges of $C_1$ and $C_2$ are summed up on said 'difference' capacitor CD (see FIG. 4E), thus generating an output voltage $V_{out}$, which is nearly the double of the single voltages appearing across $C_1$ and $C_2$— and $S_{11}$, $S_{12}$— transferring the appearing voltage $V_{out}$, measured over said 'difference' capacitor $C_D$ to the output terminals of the SC front-end as floating output signal $V_{out}$ (see FIG. 4F). The doubling of the voltages signifies an increase in sensitivity due to said differential capacitor arrangement. This process of said voltage transfers shall also be named loading and unloading said 'difference' capacitor.

Now, after one sequence consisting of said three segments fully completed, the sequence restarts again with segment I. If in the meantime the two transducer capacitors $C_{T1}$ and $C_{T2}$ have been altered, with the help of the nearly constant voltage $V_{SS}$ different charges on $C_{T1}$ and $C_{T2}$ are generated containing mainly the information about said capacitance changes but eventually also of a change in the voltage $V_{SS}$. The operations in segments I and II are fully aware of these combined change values—whereas in segment III by summing up said signals later on the 'difference' of said change values is formed by processing said floating output signal $V_{out}$ with said differential operational amplifier, thus eliminating any change in voltage $V_{SS}$, provided that there was no additional voltage change between segment I and II. A similar effect is operative for a difference in the absolute values of said two transducer capacitors $C_{T1}$ and $C_{T2}$, but now these mechanisms are active in segments I and II, where only the difference in the charges of $C_{T1}$ and $C_{T2}$ are transferred to said intermediate storage capacitors $C_1$ respectively $C_2$. What is described here with regard to possible changes in voltage $V_{SS}$, will be further strengthend by applying so-called ratiometric circuit principles in the output evaluation circuits, i.e. generating effective methods for proper referencing of measured sensor values.

In the description above a more precise diction would explain said charge transport or transfer mechanism with the help of the switching operations during the diverse time segments of said operating sequence as a distribution of charges on said transducer capacitors $C_{T1}$ and $C_{T2}$ and said intermediate storage capacitor $C_1$ (during segment I), and on said transducer capacitors $C_{T1}$ and $C_{T2}$ and said intermediate storage capacitor $C_2$ (during segment II) respectively. In segment III the charge is evenly distributed between said intermediate storage capacitors $C_1$ and $C_2$ and said 'difference' capacitor CD. An even more precise analysis of the behavior of the switched capacitors would disclose, that said transfer phenomena between said transducer capacitors $C_{T1}$ and $C_{T2}$ and said intermediate storage capacitor $C_1$ (during segment I) and said intermediate storage capacitor $C_2$ (during segment II) respectively are switching frequency dependend. For this analysis the transfer functions (ratio of output voltage versus input voltage of a two-port device) between every pair of capacitors are considered and the frequency of analysis of an applied signal is varied independently of the switching frequency of the switches taking part. Analysing in such a way, low-pass filter functions are revealed. The same holds for the switching actions regarding said intermediate storage capacitors $C_1$ and $C_2$ and said 'difference' capacitor CD. Here also a low-pass filtering characteristic can be evaluated. As an explanation attempt using plausibility arguments one can imagine, that forced switching of charges onto a capacitor in one or the other way has an effect comparable to adding a resistor to the capacitor, whereby the value of this resistor depends on the switching frequency. Thus an SC-network may be considered as an RC network, wherefrom the transfer functions are being easily calculated. Therefore it is also easily understandable, that there are many more and different ways to make low pass filter functions, e.g. the 'difference' capacitor CD can be replaced by some other combinations of capacitors or/and resistors.

Figure 5B:
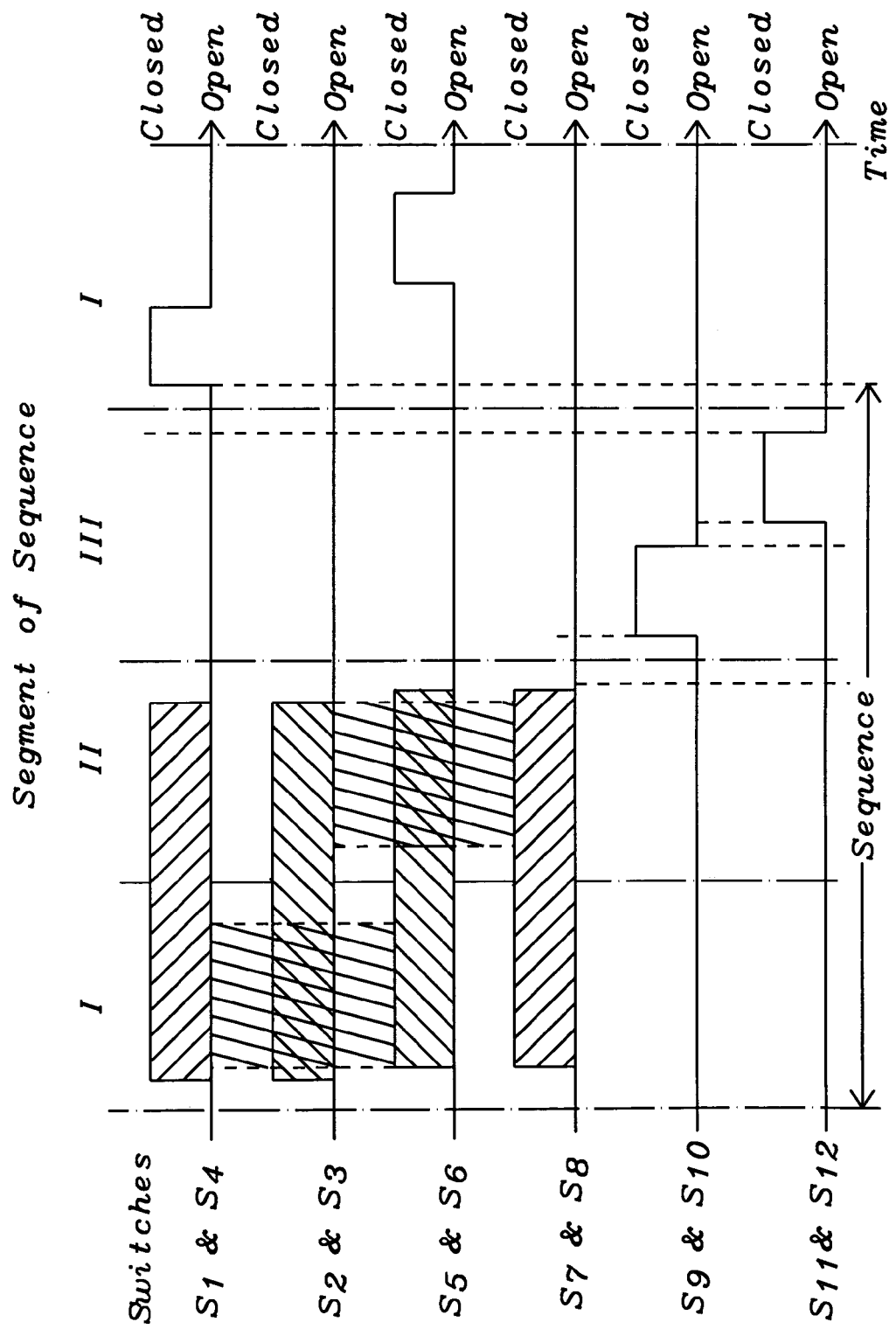
FIG. 5B shows in form of a modified time diagram another generalized view for variants of the sequential operation modes of the switches used in the circuit of said Switched Capacitor Front-End of FIG. 3.

FIG. 5B displays a modification for the operation of the pairs of switches with the help of a modified informal timing diagram comprising again of said three distinct time segments named I, II and III; whereby however in segments I and II the chronology of the switching sequences may be varied in such a way, that e.g. the switches $S_1$ to $S_8$ are sequentially operated ten times before one cycle for the switches $S_9$ to $S_{11}$ is traversed. Many other variants for the switching within segments I and II are also thinkable. The reason for this flexibility can be found in the fact, that the circuit—as already explained earlier above—is being operated with considerable oversampling, therefore leaving room for additional processing, as e.g. for noise reduction or smoothing by collecting charge averages. Time segments I and II with multiple time slots of repeated switching sequences with variable ratios (e.g. as above 10:1) will be exploited for averaging, smoothing etc. at different modes. The appearance of these modes is shown in a symbolic form in segments I and II—designated 'slotted'—of the diagrams in FIG. 5B.

Given all this from above and bearing in mind, that transfer functions can be evaluated between input and output ports and vice-versa we can deduce, that the circuit features a good RF-suppression behavior considering the passive SC front-end and its position between sensor elements and the internal active components. Equally important for this implementation is the fact, that the circuit is constructed in a rigorous symmetric way with respect to virtual ground, which therefore makes it in a great measure insensitive to electric and magnetic interfering stray fields. This is most notably evident by its elevated insensitivity against 50/60 Hz noise influences from disturbing AC environments. Another outcome of this principle is a circuit, where an external electrical charge injection is automatically compensated for, basically by its largely symmetrical topology of the essential charge sensitive components. Furthermore important is said symmetrical arrangement for the effective suppression of the influence of noise onto the results of the measurements, which already has been pointed out at various opportunities above.

Figure 6:
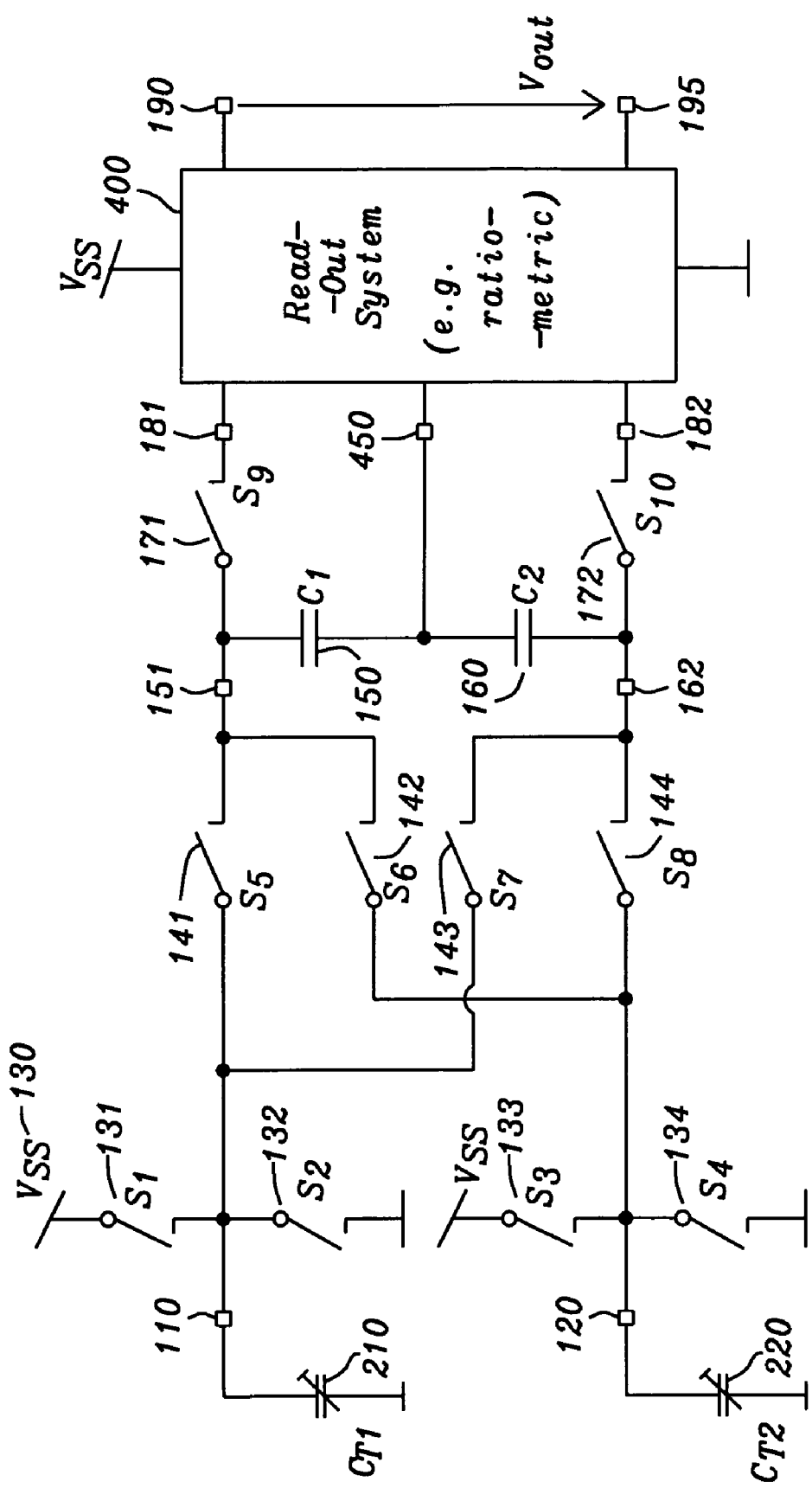
FIG. 6 shows in form of a combined circuit and block diagram another implementation proposal for the sensor input stage together with its internal storage capacitors in conjunction with a Read-Out System e.g. designed observing ratiometric circuit principles.

In FIG. 6 a modified example for an implementation of the output part of the aforementioned Switched Capacitor Front-End block 100 in FIG. 1 is depicted, shown together with said internal storage capacitors C, and $C_2$ (items 150 and 160) in conjunction with another Read-Out System (item 400) here, as an example, designed observing ratiometric circuit principles. The sensor input stage or sensor capacitor assembly $C_{T1}$ and $C_{T2}$ (items 110 and 120) and the essential two—first and second—charge switching stages are exactly the same as given in and described for FIG. 2. The two terminal points 151 and 162 are then connecting to said internal storage capacitors $C_{1\ and\ C2}$, which in turn are further connected via switches 171 and 172 respectively to the input terminals 181 and 182 of a new, more general Read-Out System block 400. On the other side these internal storage capacitors $C_1$ and $C_2$ have one terminal in common, terminal 450, connected to a voltage, which is supplied from the Read-Out System block 400 and being internally locked to some ratio of the supply voltage $V_{SS}$ of the Read-Out System block 400. Ratiometric thus signifying in this context, that rather than using a voltage reference with an absolute value, a ratio of the voltage reference of the Read-Out System block 400—derived from the supply voltage $V_{SS}$—is also applied to the signals for the Read-Out System block 400 (that is, via said capacitors. C, and $C_2$) thereby eliminating any errors introduced by a changing reference or supply voltage. As an important feature of the invention should be put on record, that the internal storage capacitors C, and $C_2$ (items 150 and 160) are connected via switches 171 and 172 to a general Read-Out System block 400, which may include a 'difference' capacitor CD, as introduced in FIG. 3—serving as an additional filter or used for level shifting—or may include other devices as amplifiers or Analog/Digital Converters (ADC), as typified in the following circuit example, FIG. 7A.

Figure 7A:
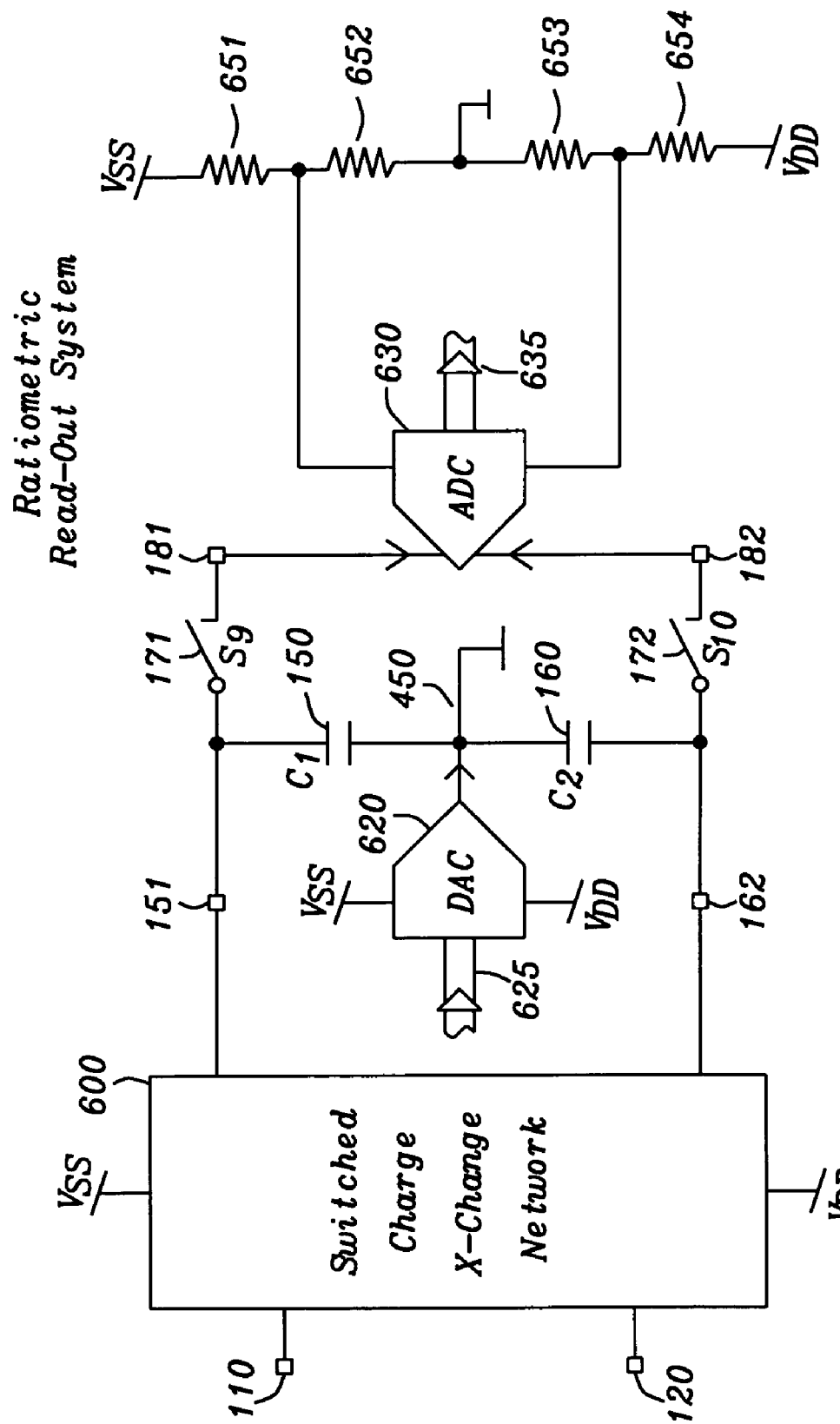
FIG. 7A shows in form of a mixed circuit and block diagram the so-called Switched Charge X-Change (exchange) Network block together with an example for the realization of a ratiometric Read-Out System.

Having a look onto the drawing of FIG. 7A, where the Switched Charge X-Change Network stage 600 can be identified, already exhaustively described and explained in conjunction with FIG. 2, and where some more possibilities for a realization of the Switched Capacitor Front-End 100 of FIG. 1 are suggested. There could be used a Digital/Analog Converter (DAC) 620 as voltage source for the voltage generation at virtual ground, the common terminal 450 for the internal storage capacitors C, (150) and $C_2$ (160). There could also be used an Analog/Digital Converter 630 for the measuring of the transducer signals from said internal storage capacitors $C_{1\ and\ C2}$ and this ADC could be driven with reference signals tied to voltage ratios of the anti-symmetrical supply voltages $V_{SS}$ and $V_{DD}$, these voltage ratios established e.g. with the help of resistive voltage dividers (651 . . . 654) thus altogether leading to an elaborate Ratiometric Read-Out System, which can be understood also as a tracking system between sensor signals and read-out values. Additionally the implementation of the DAC and the ADC could be simplified by taking advantage of comparator techniques (e.g. with respect to zero voltage or virtual ground and e.g. replacing the 'difference' capacitor CD by a comparator and so on) and the already extensively used intrinsic timing schedules. Therefore digital signal data 625 and 635 are readily obtainable for further processing. Many more and other possibilities can be thought of at this point. It should be pointed out once more, that the 'difference' capacitor CD is replaced here by an active circuit, which is sometimes favorable for an integrated circuit. Furthermore the switching operations done by the pair of switches $S_9$, $S_{10}$ (items 171 and 172) connecting to the input terminals 181 and 182 are not necessarily required. It is advantageous however, that during operation with these switches—considering the timing diagrams shown in FIG. 5A or 5B, no galvanic connections between the sensor capacitor input terminals (items 110 and 120) and the ADC input terminals (items 181 and 182) ever exist, and additionally the SC Front-End consisting only of switches and capacitors the active circuits (amplifier, comparator i.e ADC) never sees any RF-signals and no RF rectifying effects will appear.

Figure 7B:
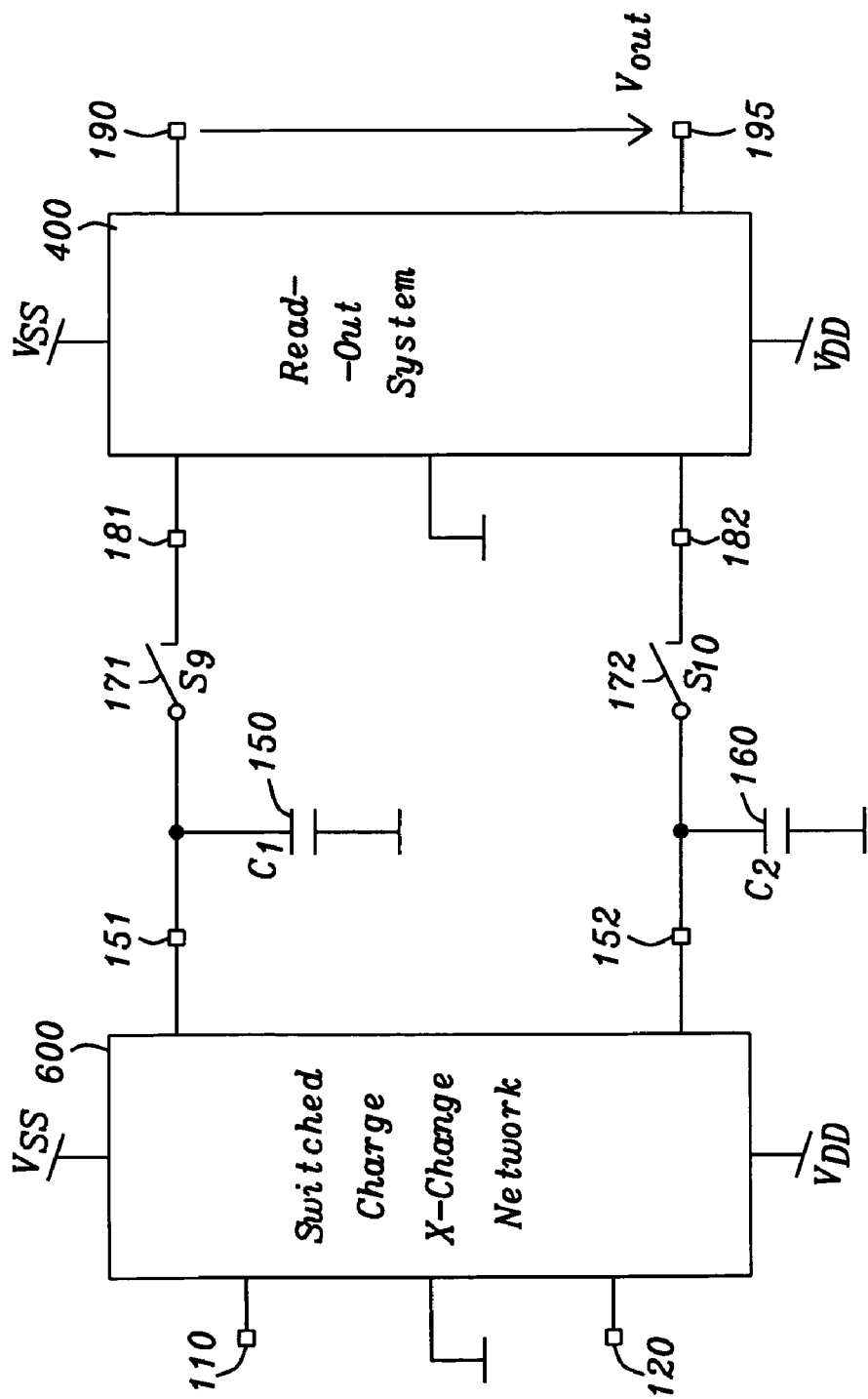
FIG. 7B shows again in form of a mixed circuit and block diagram and in a more general way said Switched Charge X-Change Network block connected to its internal storage capacitors and switched farther to the Read-Out System.
Figure 8A:
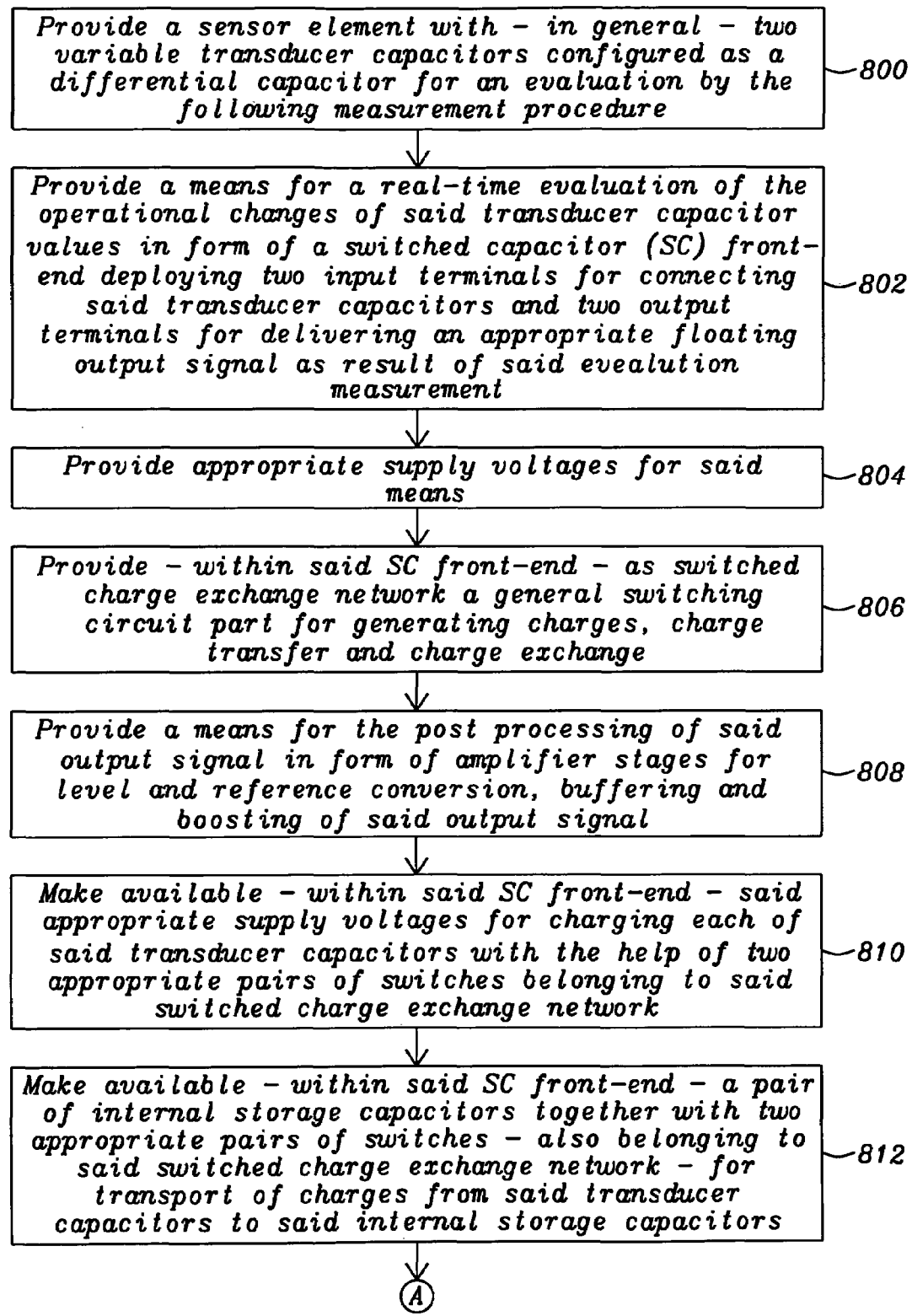
FIGS. 8A–8D list the essential elements for the realization of the method of the invention in a more general form and explain the individual steps within said more general method in form of a flow diagram.
Figure 8B:
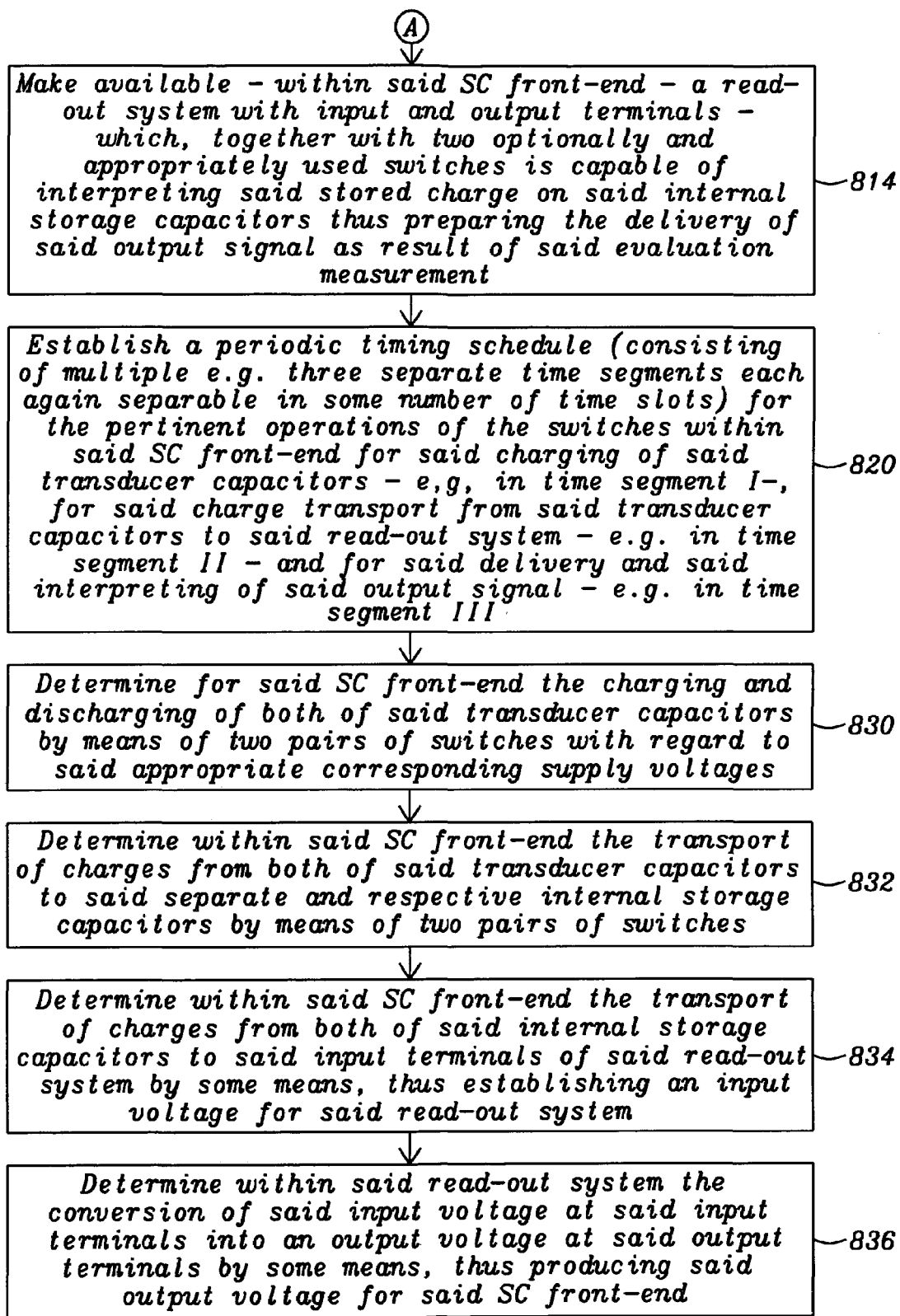
Figure 8C:
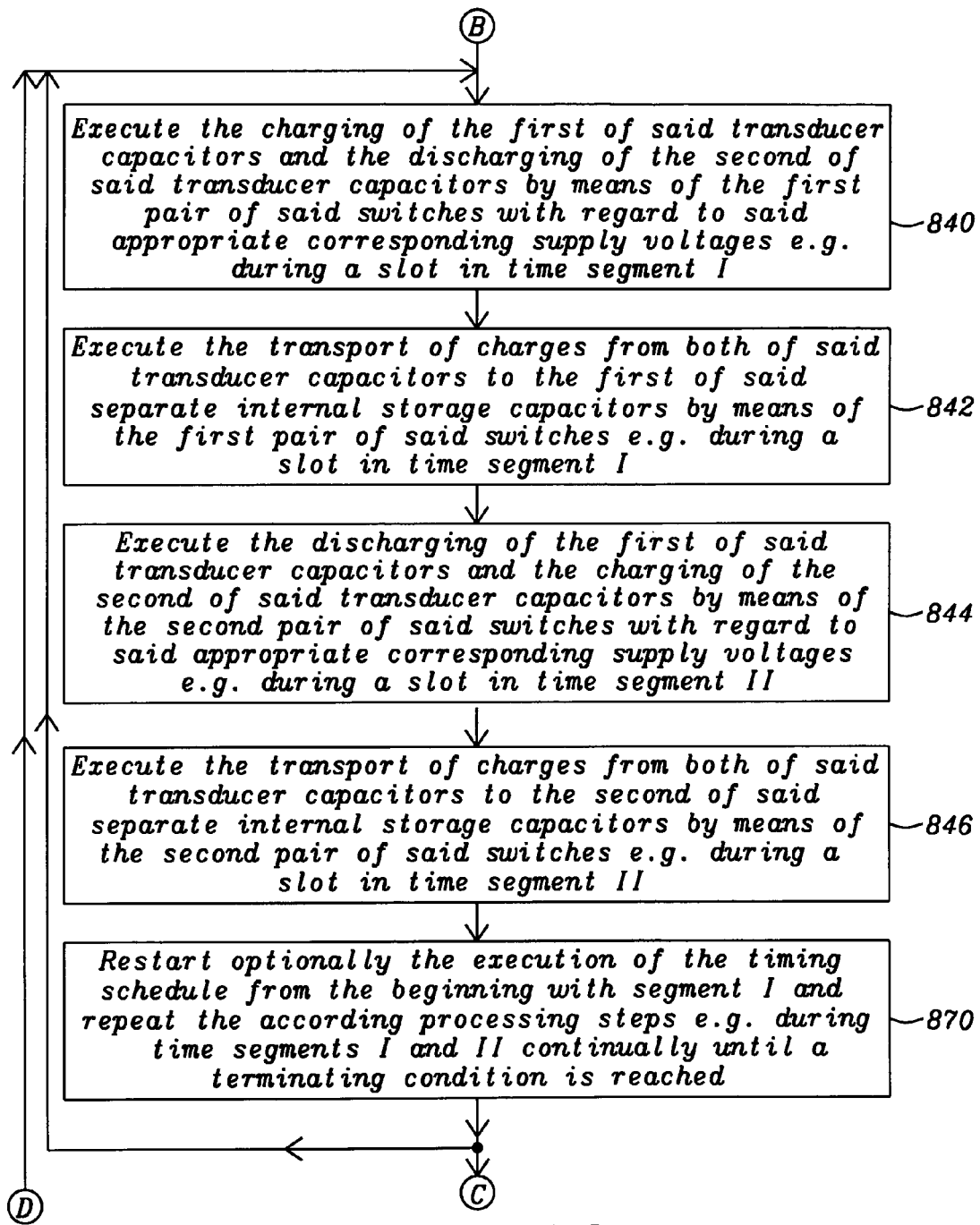
Figure 8D:
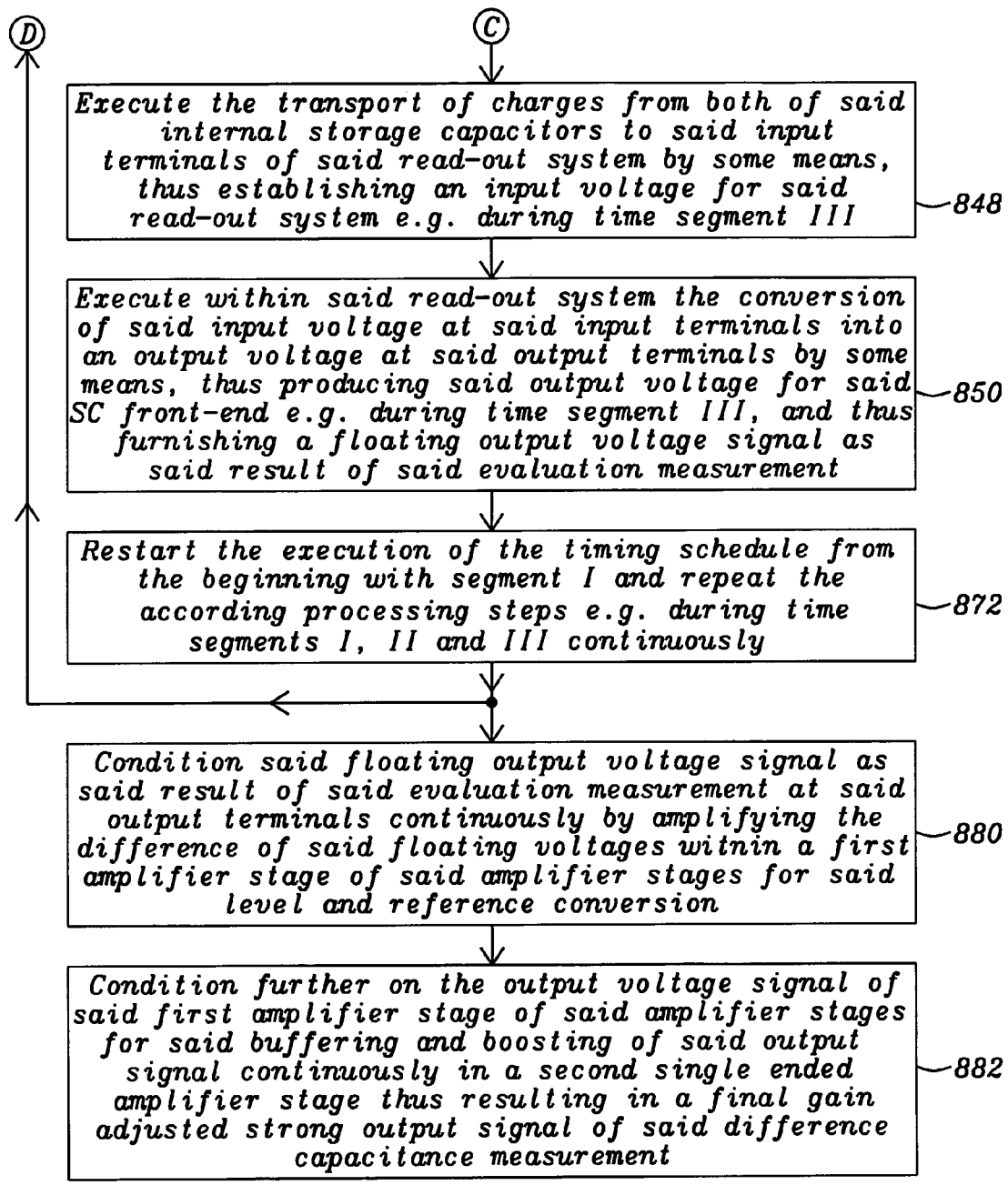
Figure 8E:
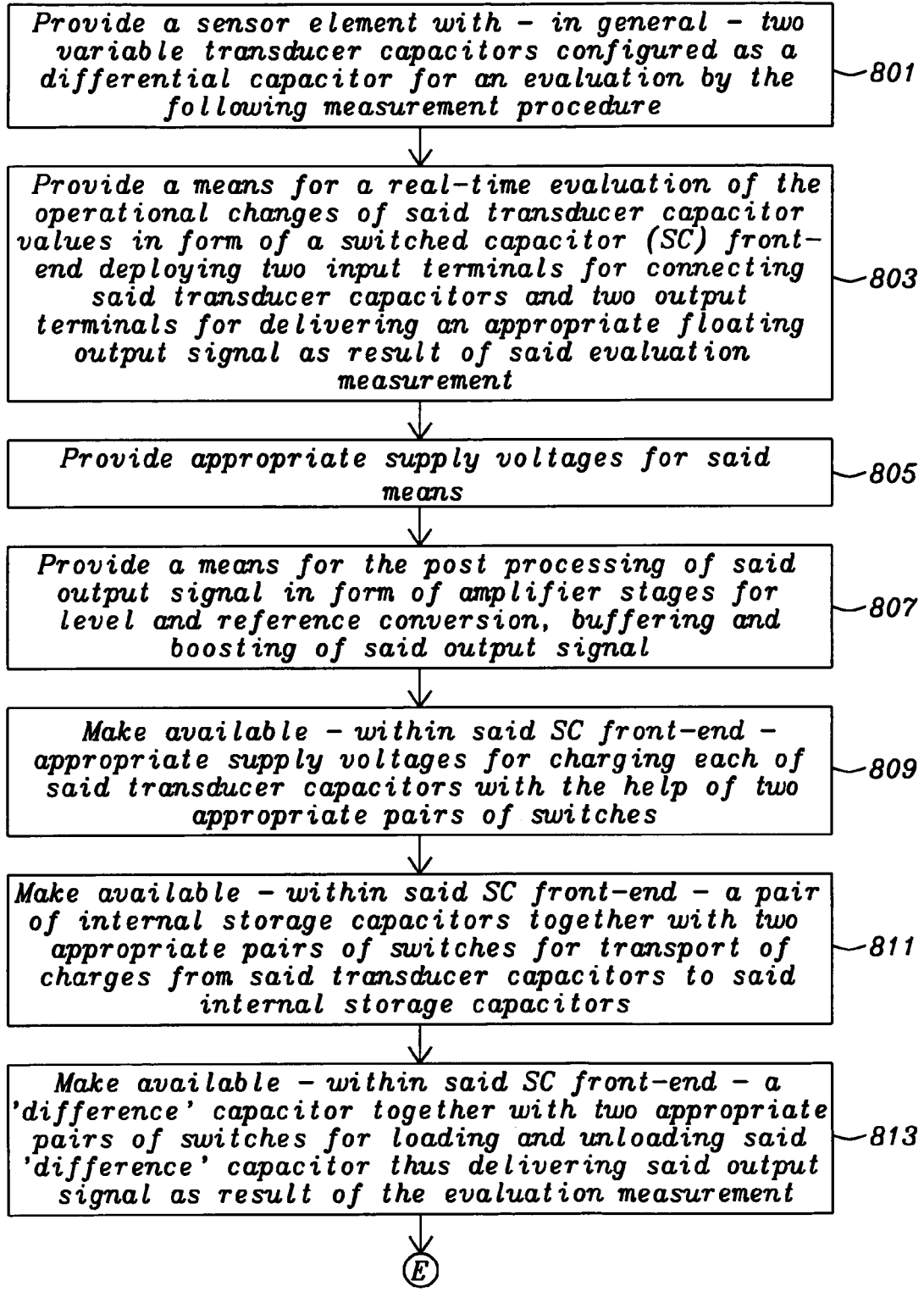
FIGS. 8E–8H list the essential elements for the realization of a special example of the method of the invention and explain the individual steps within said example method in form of a flow diagram.
Figure 8F:
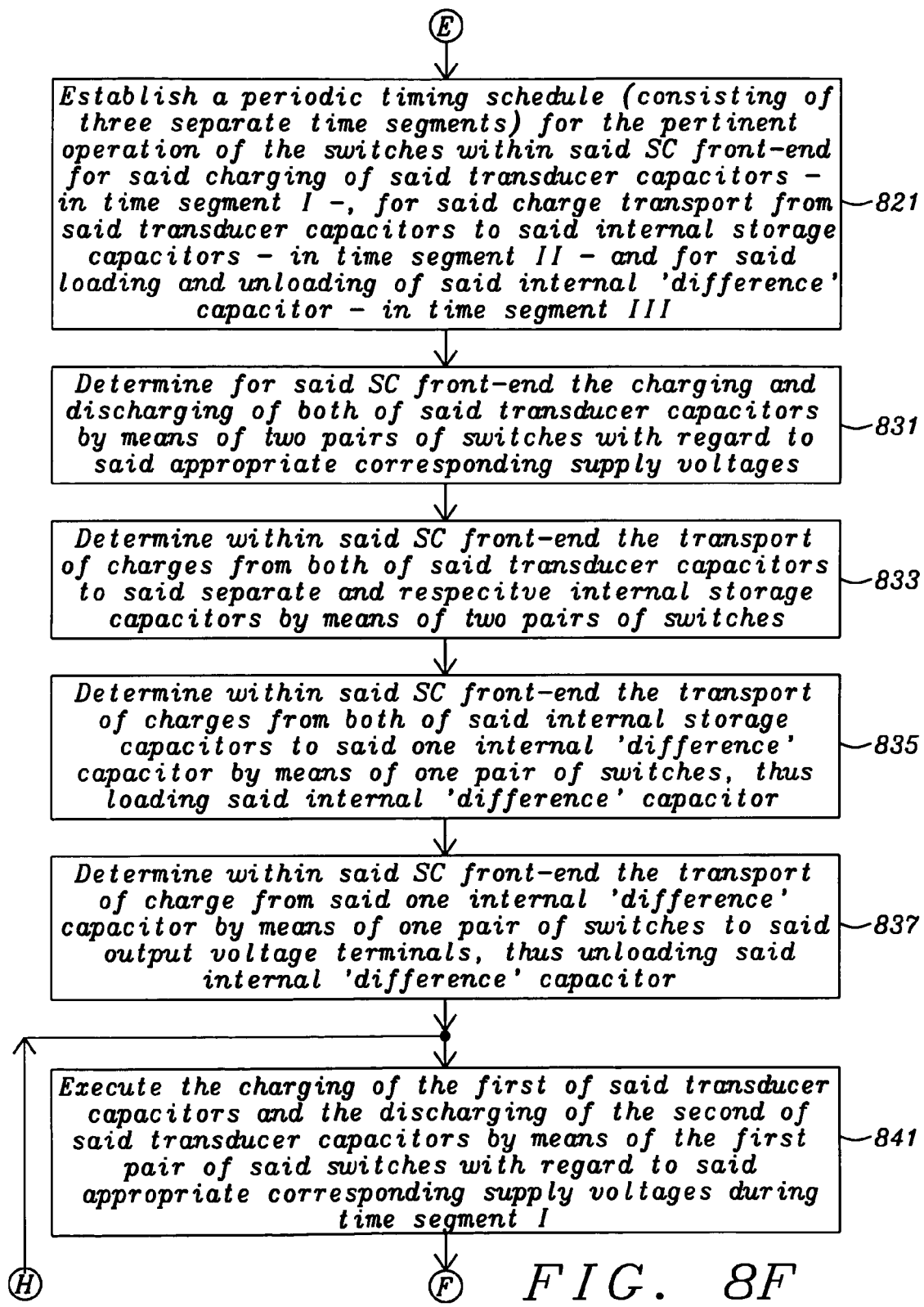
Figure 8G:
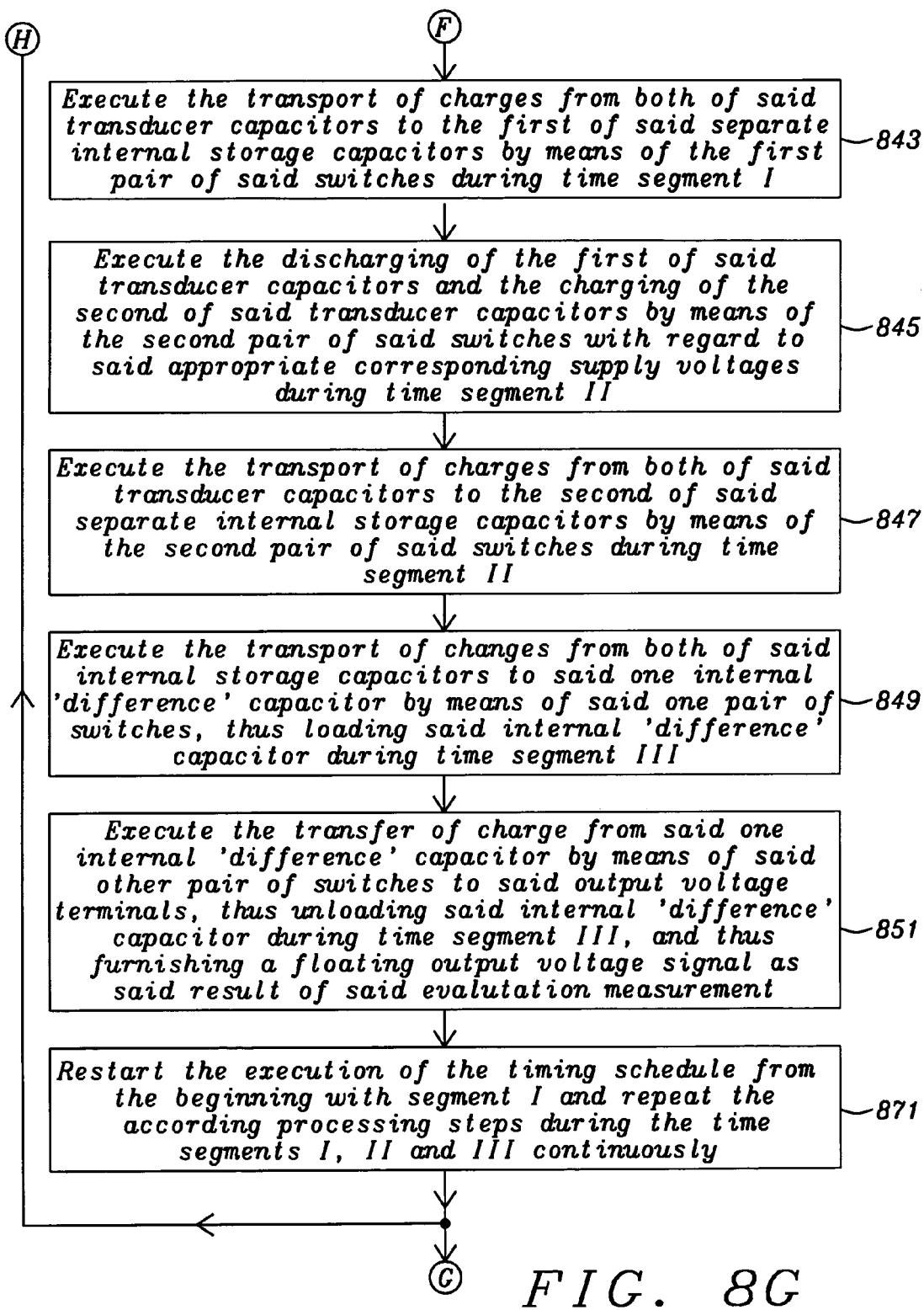
Figure 8H:
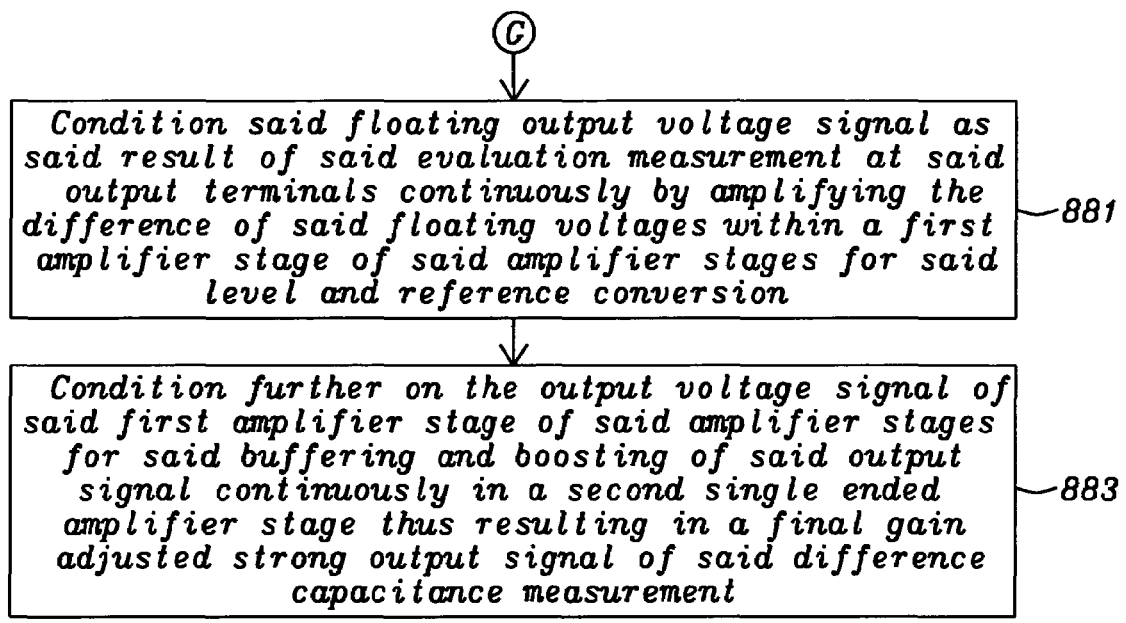

Summarizing in a more general way the different examples for a realization of the circuits of the invention—presented until now—one arrives at FIG. 7B. Here we see the Switched Charge X-Change Network block 600 with its input terminals (110 and 120), containing the well-known charge transfer and exchange switching network leading to terminals 151 and 162, these terminals connected to the internal storage capacitors $C_1$ and $C_2$ (items 150 and 160) and switched farther Into the Read-Out System block 400. This switching is however not necessary and may be omitted. If nevertheless implemented, for reasons of greater noise immunity, the latter switching is done with two switches or better a pair of switches $S_9$, $S_{10}$ (items 171 and 172) connecting to the input terminals 181 and 182 of the Read-Out System block 400, on its part delivering an output voltage $V_{out}$ to terminals 190 and 196. This better noise immunity is achieved because the Read-Out System may be disconnected during switching operations within the X-Change Network. These highly flexible and varying circuit configurations possible for this part of the circuit, namely the X-Change Network and its following stages up to the Read-Out System suggest another abbreviation for that part beginning with the Input terminals (items 110 & 120) and ending at its output terminals (items 181 & 182), reflecting the situation somewhat more illustratively, namely designate it as IXI—configuration for short. This IXI acronym can be understood as depicting the layout of the X-Change Network and its output stage iconographically, whereby the first "I" symbolizes a complementary charging voltages supplying input stage with terminals, the "X" the two pairs of crossover switches and the last "I" a charge modified voltages furnishing output stage and terminals. For the technical implementations of the "I" parts there may be used various different solutions. The supply voltages $V_{SS}$ and $V_{DD}$ are used for both, the Switched Charge X-Change Network block 600 and the Read-Out System block 400. A virtual ground terminal maybe generated thereby. This figure therefore shows all the essential parts for a differential capacitance measuring system, thus implementing the necessary basic function of operations for this invention. With the next eight figures flow diagrams for a general method and an example of a more specific method for appropriate implementations regarding this invention are given.

Referring now to FIGS. 8A–8D, where a flow diagram is listing the essential elements for the realization of the general overall method of the invention and where the basic individual steps within said method are explained, we find distinct groups of steps of the method corresponding to the basic building blocks of the circuit (as shown especially in FIG. 1, FIG. 2 and in FIG. 7B) of the invention and their operations. In their first steps (items 800 . . . 808) the generalized version of the new method of this invention provides the means for their implementation as follows: first, provide a sensor element with—in general—two variable transducer capacitors configured as a differential capacitor for an evaluation by the following measurement procedure (item 800); second, provide a means for a real-time evaluation of the operational changes of said transducer capacitor values in form of a switched capacitor (SC) front-end deploying two input terminals for connecting said transducer capacitors and two output terminals for delivering an appropriate floating output signal as result of said evaluation measurement (item 802); third, provide appropriate supply voltages for said means (item 804); fourth, provide—within said SC front-end—as switched charge exchange network a general switching circuit part for generating charges, charge transfer and charge exchange (item 806) and fifth, provide a means for the post processing of said output signal in form of amplifier stages for level and reference conversion, buffering and boosting of said output signal (item 808). The following steps describe howto make available—within said SC front-end—said appropriate supply voltages for charging each of said transducer capacitors with the help of two appropriate pairs of switches belonging to said switched charge exchange network (item 810) and howto make available—within said SC front-end—a pair of internal storage capacitors together with two appropriate pairs of switches—also belonging to said switched charge exchange network—for transport of charges from said transducer capacitors to said internal storage capacitors (item 812). Further, howto make available—within said SC front-end—a read-out system with input and output terminals—which, together with two optionally and appropriately used switches is capable of interpreting said stored charge on said internal storage capacitors thus preparing the delivery of said output signal as result of said evaluation measurement (item 814). Now is explained howto establish a periodic timing schedule (consisting of multiple e.g. three separate time segments each again separable in some number of time slots) for the pertinent operation of the switches within said SC front-end for said charging of said transducer capacitors—e.g. in time segment I—, for said charge transport from said transducer capacitors to said read-out system—e.g. in time segment II—and for said delivery and said interpreting of said output signal—e.g. in time segment III (item 820). The next four steps determine for said SC front-end the charging and discharging of both of said transducer capacitors by means of two pairs of switches with regard to said appropriate corresponding supply voltages (item 830) and also within said SC front-end the transport of charges from both of said transducer capacitors to said separate and respective internal storage capacitors by means of two pairs of switches (item 832) and further again within said SC front-end the transport of charges from both of said internal storage capacitors to said input terminals of said read-out system by some means, thus establishing an input voltage for said read-out system (item 834) and finally again within said read-out system the conversion of said input voltage at said input terminals into an output voltage at said output terminals by some means, thus producing said output voltage for said SC front-end (item 836). Now an anchor-step starts to execute the charging of the first of said transducer capacitors and the discharging of the second of said transducer capacitors by means of the first pair of said switches with regard to said appropriate corresponding supply voltages e.g. during a slot in time segment I (item 840), continuing to execute the transport of charges from both of said transducer capacitors to the first of said separate internal storage capacitors by means of the first pair of said switches e.g. during a slot in time segment I (item 842) and to execute the discharging of the first of said transducer capacitors and the charging of the second of said transducer capacitors by means of the second pair of said switches with regard to said appropriate corresponding supply voltages e.g. during a slot in time segment II (item 844) and finally to execute the transport of charges from both of said transducer capacitors to the second of said separate internal storage capacitors by means of the second pair of said switches e.g. during a slot in time segment II (item 846). The next step defines a condition and optionally a processing loop back to said anchor-step 840 by restarting the execution of the timing schedule from the beginning with segment I and repeating the according processing steps e.g. during time segments I and II continuously until said condition is met (item 870). To execute the transport of charges from both of said internal storage capacitors to said input terminals of said read-out system by some means, thus establishing an input voltage for said read-out system e.g. during time segment III, thus furnishing said floating output voltage signal as said result of said evaluation measurement (item 848) and to execute within said read-out system the conversion of said input voltage at said input terminals into an output voltage at said output terminals by some means, thus producing said output voltage for said SC front-end e.g. during time segment III, thus furnishing said floating output voltage signal as said result of said evaluation measurement (item 850) is the task of said steps 848 and 850 until the next step restarts the execution of the timing schedule from the beginning with segment I and repeating the according processing steps e.g. during time segments I, II and III continuously (item 872), again beginning with said anchor-step 840. In the last two steps (items 880 and 882) of the general method of the invention is described, howto condition said floating output voltage signal as said result of said evaluation measurement at said output terminals continuously by amplifying the difference of said floating voltages within a first amplifier stage of said amplifier stages for said level and reference conversion (item 880) and howto condition further on the output voltage signal of said first amplifier stage of said amplifier stages for said buffering and boosting of said output signal continuously in a second single ended amplifier stage thus resulting in a final gain adjusted strong output signal of said difference capacitance measurement (item 882).

Referring now to FIGS. 8E–8H, where a flow diagram is listing the elements for the realization of an example with said method of the invention and where the individual steps within said method are explained in more detail, again referable to their respective parts in the description of the circuits (as shown in FIG. 1 and elaborated in FIG. 3). In several first steps (items 801 . . . 807) an example for a specialized version of the new method of this invention provides a sensor element with-in general-two variable transducer capacitors configured as a differential capacitor (item 801) and is also providing a means for a real-time evaluation of the operational changes of said transducer capacitor values in form of a switched capacitor (SC) front-end deploying two input terminals for connecting said transducer capacitors and two output terminals for delivering an appropriate output signal as result of the evaluation measurement (item 803). Another step includes howto provide appropriate supply voltages for said means (item 805). Further is provided a means for the post processing of said output signal in form of amplifier stages for level and reference conversion, buffering and boosting of said output signal (item 807). The next following steps prepare for the determination and execution steps of the new method (items 809 . . . 871). They make available—within said SC front-end—appropriate supply voltages for charging each of said transducer capacitors with the help of two appropriate pairs of switches (item 809) and also make available—within said SC front-end—a pair of internal storage capacitors together with two appropriate pairs of switches for transport of charges from said transducer capacitors to said internal storage capacitors (item 811), further on they make available—within said SC front-end—a 'difference' capacitor together with two appropriate pairs of switches for loading and unloading said 'difference' capacitor thus delivering said output signal as result of the evaluation measurement (item 813). Another step (item 821) establishes a periodic timing schedule (consisting of three separate time segments) for the pertinent operation of the switches within said SC front-end for said charging of said transducer capacitors—in time segment I—, for said charge transport from said transducer capacitors to said internal storage capacitors—in time segment II—and for said loading and unloading of said internal 'difference' capacitor-in time segment III. Further steps determine for said SC front-end the charging and discharging of both of said transducer capacitors by means of two pairs of switches with regard to said appropriate corresponding supply voltages (item 831) and also determine within said SC front-end the transport of charges from both of said transducer capacitors to said separate and respective internal storage capacitors by means of two pairs of switches (item 833). They equally determine within said SC front-end the transport of charges from both of said internal storage capacitors to said one internal 'difference' capacitor by means of one pair of switches, thus loading said internal 'difference' capacitor (item 835) and finally determine within said SC front-end the transfer of charge from said one internal 'difference' capacitor by means of one pair of switches to said output voltage terminals, thus unloading said internal 'difference' capacitor (item 837). Now are following all the execution steps, starting with the execution of the charging of the first of said transducer capacitors and the discharging of the second of said transducer capacitors by means of the first pair of said switches with regard to said appropriate corresponding supply voltages during time segment I (item 841), then the transport of charges from both of said transducer capacitors to the first of said separate internal storage capacitors by means of the first pair of said switches during time segment I is executed (item 843). Completely complementary now the next step executes the discharging of the first of said transducer capacitors and the charging of the second of said transducer capacitors by means of the second pair of said switches with regard to said appropriate corresponding supply voltages during time segment II (item 845) and also executes the transport of charges from both of said transducer capacitors to the second of said separate internal storage capacitors by means of the second pair of said switches during time segment II (item 845). Secluding the execution processing the transport of charges has to be executed from both of said internal storage capacitors to said one internal 'difference' capacitor by means of said one pair of switches, thus loading said internal 'difference' capacitor during time segment III (item 849) and finally the transfer of charge from said one internal 'difference' capacitor by means of said one other pair of switches to said output voltage terminals is executed, thus unloading said internal 'difference' capacitor during time segment II, thus furnishing said output voltage signal as said result of said evaluation measurement (item 851). A further step makes clear, that a restart of the execution of the timing schedule from the beginning with segment I and the repetition of the according processing steps during time segments I, II and III continuously takes place (item 871), thus closing the execution loop by going back to the beginning of step 841. Completing the method some more steps are necessary conditioning said floating output voltage signal as said result of said evaluation measurement at said output terminals continuously by amplifying the difference of said floating voltages within a first amplifier stage of said amplifier stages for said level and reference conversion (item 881) and conditioning further on the output voltage signal of said first amplifier stage of said amplifier stages for said buffering and boosting of said output signal continuously in a second single ended amplifier stage thus resulting in a final gain adjusted strong output signal of said difference capacitance measurement (item 883). This concludes now the operational and processing steps of an example for the new method of the invention.

As shown in the preferred embodiments as described and explained above, the novel circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, capable of evaluating small variations in magnitude of capacitance within a differential capacitor arrangement forming a transducer and thus apt for real-time evaluating and measuring said differential capacitive transducers with high sensitivity and great noise immunity, implemented as a pair of sensor capacitors, connected normally to the two input terminals of said circuit and delivering a precise and stable output signal as result of said measurement to its output terminals, comprising:

capacitive sensor elements or transducers in form of capacitors, connected to input terminals of evaluation means and designated as transducer capacitors;

means for evaluating said small variations in magnitude of capacitance in real-time and thus measuring said capacitive sensor elements, delivering output signals as result of said measurement and consisting of some means for charging and discharging said transducer capacitors with charges delivered by appropriate supply voltages, means for transferring and exchanging said charges implemented in form of a switching network, and means for transforming said transferred and applicatively exchanged charges into voltages equivalent to said output signals implemented within read-out system;

means for internal intermediate storage of electrical energy, assembled as a four-pole (two-port) circuit exhibiting two input and two output terminals; and amplifier stages connected to said output terminals of said means for internal intermediate storage of electrical energy, delivering a boosted output signal at the output terminals of the circuit.

2. The circuit according to claim 1 wherein said means for evaluating said small variations in magnitude of capacitance in real-time and thus measuring said capacitive sensor elements is implemented as a switched capacitor front-end, comprising:

means for transferring and exchanging said charges implemented in form of a switching network featuring a pair of switching network input terminals, a pair of switching network output terminals, and terminals for supply voltages and/or a ground terminal;

means for transforming said transferred charges into voltages thus implementing said read-out system featuring a pair of read-out system input terminals, a pair of read-out system output terminals, and terminals for supply voltages and/or a ground terminal; and a pair of two capacitors where this pair of capacitors represent said means for internal intermediate storage of electrical energy now in form of electrical charges:

each capacitor with a first and a second electrode and each capacitor connected with said first electrode to its respective terminal of said pair of switching network output terminals, furthermore connected with said first electrode via some connection means to its respective terminal of said pair of read-out system input terminals and both capacitors connected together with their other, second electrodes to a common point as said virtual ground terminal.

3. The circuit according to claim 2 wherein each of said connection means consists of a simple conducting wire connection.

4. The circuit according to claim 2 wherein each of said connection means consists of a single pole switch.

5. The circuit according to claim 1 wherein said means for charging and discharging said transducer capacitors with charges delivered by appropriate supply voltages comprises:

one in-out connection terminal for each of said capacitors;

two connection terminals for said supply voltages and/or ground; and one pair of switches for every of said capacitors, consisting of two single pole on-off switches with a first and a second pin, wherefrom said first pins are connected together and equally to one electrode of said transducer capacitors and also to said in-out connection terminal, wherefrom said second pins are connected pairwise to said connection terminals for said power supplies and/or said ground for each of said capacitors and whereby said switches are being operated—i.e. closed (on) and opened (off)—crosswise by pairs in an alternating fashion thus alternatively charging and discharging said transducer capacitors.

6. The circuit according to claim 5 wherein said switches are implemented as Field Effect Transistors (FETs).

7. The circuit according to claim 1 wherein said means for transferring and exchanging said charges implemented in form of a switching network comprises:

one pair of input terminals, i.e. one input connection terminal for each of said transducer capacitors;

one pair of output terminals, i.e. one output connection terminal corresponding to each of said transducer capacitors and connected appropriately to said means for internal intermediate storage of electrical charges; and two pairs of switches, thereby one pair of said switches being associated with each of said transducer capacitors and being interconnected to said pair of output terminals, consisting of two single pole on-off switches with a first and a second pin each, said first pins of each switch of every pair of said switches connected each with one of said input terminals thus enabling a crossover connection possibility for each output terminal, whereto said second pins of said switches are connected in such a way, that each of said second pins of said pairs of switches is connecting together to one of said output terminals; showing an IXI-configuration for said pairs of switches, where the terminal points may be thought of being the common points on top and at bottom of said IXI-configuration.

8. The circuit according to claim 7 wherein said switches are implemented as Field Effect Transistors (FETs).

9. The circuit according to claim 1 wherein said means for internal intermediate storage of electrical energy stores said energy in form of electrical charges and comprises capacitors connected to the output terminals of said switching network.

10. The circuit according to claim 9 wherein said capacitors for said storage of electrical charges are composed of two capacitors, which are—in connection with said switching network—functioning as a low-pass filter.

11. The circuit according to claim 9 wherein said capacitors for said storage of electrical charges are composed of two capacitors, each connected with one electrode to said output terminals of said switching network and their other electrodes connected together at one common point.

12. The circuit according to claim 11 wherein said common point is tied to ground.

13. The circuit according to claim 11 wherein said common point is tied to a reference voltage, furnished as output signal by said read-out system.

14. The circuit according to claim 13 wherein said read-out system generates said output signal, comprising:

a digital/analog converter, delivering said reference voltage to said common point; and an analog/digital converter itself being biased by reference voltages, derived with resistive dividers from said supply voltages thus being designed for adoption of a so-called ratiometric operation mode.

15. The circuit according to claim 1 wherein said means for transforming said transferred and applicatively exchanged charges into voltages equivalent to said output signal is implemented within said read-out system, comprising:

one pair of single pole on-off input switches, each switch connected with one pin to said means for internal intermediate storage of electrical charges;

one pair of single pole on-off output switches, each switch connected with one pin to said amplifier stages and the other pins of said input and output switches, both respectively connected together at one connection point, thus connecting each of said input and output switches in series; and one floating 'difference' capacitor, its electrodes connected between said connection points of said input and said output switches connected in series.

16. The circuit according to claim 15 wherein said 'difference' capacitor—in connection with said pair of single pole on-off input switches—is dimensioned and functioning as a low-pass filter.

17. The circuit according to claim 15 wherein said switches are implemented as Field Effect Transistors (FETs).

18. The circuit according to claim 1 wherein said means for transforming said transferred and applicatively exchanged charges into voltages equivalent to said output signal is implemented within said read-out system, comprising:

one pair of single pole on-off input switches, each switch connected with one pin to said means for internal intermediate storage of electrical energy;

one pair of single pole on-off output switches, each switch connected with one pin to said amplifier stages and the other pins of said input and output switches, both respectively connected together at one connection point, thus connecting each of said input and output switches in series; and two capacitors, its electrodes connected on one side to said connection point between said input and said output switches respectively and on the other side connected together to a common point.

19. The circuit according to claim 18 wherein said capacitors—in connection with said pair of single pole on-off input switches—are dimensioned and functioning as a low-pass filter.

20. The circuit according to claim 18 wherein said switches are implemented as Field Effect Transistors (FETs).

21. The circuit according to claim 1 wherein said means for transforming said transferred and applicatively exchanged charges into voltages equivalent to said output signal is implemented within said read-out system which comprises active circuits and resistors, connected to a common point tied to a reference voltage.

22. The circuit according to claim 21 wherein said read-out system generates said output signal, comprising:

a digital/analog converter, delivering said reference voltage to said common point; and an analog/digital converter, being fed by said voltages equivalent to said output signal and itself being biased by reference voltages, derived with resistive dividers from said supply voltages thus being designed for adoption of a so-called ratiometric operation mode.

23. The circuit according to claim 1 wherein said amplifier stages connected to the output terminals of said means for internal intermediate storage of electrical energy are implemented as a multiple stage amplifier, which starts with a differential amplifier stage as a differential operational amplifier and ends with an impedance converter stage as a non-inverting operational amplifier, delivering said precise and stable output signal.

24. The circuit according to claim 1 wherein said means for evaluating said small variations in magnitude of capacitance in real-time and thus measuring said capacitive sensor elements is implemented as a switched capacitor front-end, comprising:

two input terminals for connecting said two capacitive sensor elements designated as transducer capacitors;

two supply voltage terminals for connecting appropriate positive and negative supply voltages;

one virtual ground terminal for connecting to a reference potential;

two output terminals for delivering said output signal as result of said measurement;

two internal storage capacitors for the intermediate storage of the difference of charges from said transducer capacitors;

two pairs of switches for connecting said two transducer capacitors to said positive and negative supply voltages, whereby each transducer capacitor is separately and alternatively being connected to either said positive or said negative supply voltage;

two pairs of switches for connecting said capacitive sensor elements to said two internal storage capacitors; whereby both transducer capacitors are commonly but alternatively being connected to either the first internal storage capacitor or the second internal storage capacitor;

one 'difference' capacitor for the summing up of the charges from said two internal storage capacitors onto said 'difference' capacitor;

one pair of switches for connecting said two internal storage capacitors to said 'difference' capacitor; and one pair of switches for connecting said 'difference' capacitor with its appearing output voltage to said two output terminals for delivering said output signal.

25. The circuit according to claim 24 wherein at any time given an essential galvanic connection from said input terminals—whereto said capacitive sensor elements are connected—to the output terminals of said read-out system is avoided, thus featuring an excellent radio frequency noise suppression from input to output and vice-versa.

26. The circuit according to claim 24 whereby extreme symmetrical construction principles are observed, symmetrical in view of the arrangement of all paired capacitors, all paired switches and all supply voltage and connection lines used within all said means of the circuit, particularly regarding their positions relating to each other and especially relating to ground, thus resulting in an excellent 50/60 Hz noise insensitivity of the circuit.

27. The circuit according to claim 24 wherein said switches are implemented as Field Effect Transistors (FETs).

28. The circuit according to claim 24 manufactured in integrated circuit technology.

29. The circuit according to claim 24 manufactured as an integrated circuit in CMOS technology.

30. The circuit according to claim 1 wherein at any time given an essential galvanic connection from said input terminals—whereto said capacitive sensor elements are connected—to the output terminals of said read-out system is avoided, thus featuring an excellent radio frequency noise suppression from input to output and vice-versa.

31. The circuit according to claim 1 whereby extreme symmetrical construction principles are observed, symmetrical in view of the arrangement of all paired capacitors, all paired switches and all supply voltage and connection lines used within all said means of the circuit, particularly regarding their positions relating to each other and especially relating to ground, thus resulting in an excellent 50/60 Hz noise insensitivity of the circuit.

32. The circuit according to claim 1 used as driver circuit for actuator buttons implementing a non-mechanical switch.

33. The circuit according to claim 1 used as driver circuit for proximity sensors using the change of the dielectric constant of a dedicated capacitor element.

34. The circuit according to claim 1 used as evaluation circuit for sensors detecting humidity or for measuring moisture.

35. The circuit according to claim 1 used as driver or evaluation circuit for non-contact displacement measurements as adopted in capacitive displacement transducers.

36. The circuit according to claim 1 manufactured in integrated circuit technology.

37. The circuit according to claim 1 manufactured as an integrated circuit in CMOS technology.

38. A circuit, capable of evaluating small variations in magnitude of capacitance within a differential capacitor arrangement forming a transducer and thus apt for real-time evaluating and measuring said differential capacitive transducers with high sensitivity and great noise immunity, implemented as a pair of sensor capacitors, connected normally to the two input terminals of said circuit and delivering a precise and stable output signal as result of said measurement to its output terminals, comprising:
- capacitive sensor elements or transducers in form of capacitors, connected to said input terminals of said circuit and designated as transducer capacitors;
- two input terminals for connecting said two capacitive sensor elements designated as transducer capacitors;
- two supply voltage terminals for connecting appropriate positive and negative supply voltages;
- one virtual ground terminal for connecting to a reference potential;
- two output terminals for delivering said output signal as result of said measurement;
- two internal storage capacitors for the intermediate storage of the difference of charges from said transducer capacitors;
- two pairs of switches for connecting said two transducer capacitors to said positive and negative supply voltages, whereby each transducer capacitor is separately and alternatively being connected to either said positive or said negative supply voltage;
- two pairs of switches for connecting said capacitive sensor elements to said two internal storage capacitors; whereby both transducer capacitors are commonly but alternatively being connected to either the first internal storage capacitor or the second internal storage capacitor;
- one 'difference' capacitor for the summing up of the charges from said two internal storage capacitors onto said 'difference' capacitor;
- one pair of switches for connecting said two internal storage capacitors to said 'difference' capacitor;
- one pair of switches for connecting said 'difference' capacitor with its appearing output voltage to two internal terminals;
- one amplifier stage connected to said two internal terminals and implemented as a multiple stage amplifier, which starts with a differential amplifier stage as a differential operational amplifier and ends with an impedance converter stage as a non-inverting operational amplifier, delivering said precise and stable output signal.

39. The circuit according to claim 38 wherein at any time given an essential galvanic connection from said input terminals—whereto said capacitive sensor elements are connected—to the output terminals of said read-out system is avoided, thus featuring an excellent radio frequency noise suppression from input to output and vice-versa.

40. The circuit according to claim 38 whereby extreme symmetrical construction principles are observed, symmetrical in view of the arrangement of all paired capacitors, all paired switches and all supply voltage and connection lines used within all said means of the circuit, particularly regarding their positions relating to each other and especially relating to ground, thus resulting in an excellent 50/60 Hz noise insensitivity of the circuit.

41. The circuit according to claim 38 used as driver circuit for actuator buttons implementing a non-mechanical switch.

42. The circuit according to claim 38 used as driver circuit for proximity sensors using the change of the dielectric constant of a dedicated capacitor element.

43. The circuit according to claim 38 used as evaluation circuit for sensors detecting humidity or for measuring moisture.

44. The circuit according to claim 38 used as driver or evaluation circuit for non-contact displacement measurements as adopted in capacitive displacement transducers.

45. The circuit according to claim 38 wherein said switches are implemented as Field Effect Transistors (FETs).

46. The circuit according to claim 38 manufactured in integrated circuit technology.

47. The circuit according to claim 38 manufactured as an integrated circuit in CMOS technology.

48. A method for differential capacitance measurements, capable of evaluating small capacitance variations within a differential capacitor arrangement forming a transducer and thus apt for real-time evaluation and measurement of said differential capacitive transducers with high sensitivity and great noise immunity, comprising:
- providing a sensor element with at least two variable transducer capacitors configured as a differential capacitor for an evaluation by the following measurement procedure;
- providing a means for a real-time evaluation of the operational variations of said transducer capacitor values in form of a switched capacitor (SC) front-end deploying two input terminals for connecting said transducer capacitors and two output terminals for delivering an appropriate output signal as result of the evaluation measurement;
- providing appropriate supply voltages for said means;
- providing—within said SC front-end—as switched charge exchange network a general switching circuit part for generating charges, charge transfer and charge exchange;
- providing a means for the post processing of said output signal in form of amplifier stages for level and reference conversion, buffering and boosting of said output signal;
- making available—within said SC front-end—said appropriate supply voltages for charging each of said transducer capacitors with the help of two appropriate pairs of switches belonging to said switched charge exchange network;
- making available—within said SC front-end—a pair of internal storage capacitors together with two appropriate pairs of switches—also belonging to said switched charge exchange network—for transport of charges from said transducer capacitors to said internal storage capacitors;
- making available—within said SC front-end—a read-out system with input and output terminals—which, together with two optionally and appropriately used switches is capable of interpreting said stored charge on said internal storage capacitors thus preparing the delivery of said output signal as result of said evaluation measurement;

establishing a periodic timing schedule (comprising at least three separate time segments each again separable in some number of time slots) for the pertinent operation of the switches within said SC front-end for said charging of said transducer capacitors in time segment I, for said charge transport from said transducer capacitors to said read-out system in time segment II and for said delivery and said interpreting of said output signal in time segment III;

determining for said SC front-end the charging and discharging of both of said transducer capacitors by means of two pairs of switches with regard to said appropriate corresponding supply voltages;

determining within said SC front-end the transport of charges from both of said transducer capacitors to said separate and respective internal storage capacitors by means of two pairs of switches;

determining within said SC front-end the transport of charges from both of said internal storage capacitors to said input terminals of said read-out system by some means, thus establishing an input voltage for said read-out system;

determining within said read-out system the conversion of said input voltage at said input terminals into an output voltage at said output terminals, thus producing said output voltage for said SC front-end;

executing the charging of the first of said transducer capacitors and the discharging of the second of said transducer capacitors by means of the first pair of said switches with regard to said appropriate corresponding supply voltages e.g. during a slot in time segment I;

executing the transport of charges from both of said transducer capacitors to the first of said separate internal storage capacitors by means of the first pair of said switches during a slot in time segment I;

executing the discharging of the first of said transducer capacitors and the charging of the second of said transducer capacitors by means of the second pair of said switches with regard to said appropriate corresponding supply voltages e.g. during a slot in time segment II;

executing the transport of charges from both of said transducer capacitors to the second of said separate internal storage capacitors by means of the second pair of said switches during a slot in time segment II;

restarting optionally the execution of the timing schedule from the beginning with segment I and repeat the according processing steps during time segments I and II continuously until a terminating condition is reached;

executing the transport of charges from both of said internal storage capacitors to said input terminals of said read-out system by some means, thus establishing an input voltage for said read-out system e.g. during time segment III;

executing within said read-out system the conversion of said input voltage at said input terminals into an output voltage at said output terminals, thus producing said output voltage for said SC front-end e.g. during time segment III, and thus furnishing a floating output voltage signal as said result of said evaluation measurement;

restarting the execution of the timing schedule from the beginning with segment I and repeat the according processing steps e.g. during time segments I, II and III continuously;

conditioning said floating output voltage signal as said result of said evaluation measurement at said output terminals continuously by amplifying the difference of said floating voltages within a first amplifier stage of said amplifier stages for said level and reference conversion; and conditioning further on the output voltage signal of said first amplifier stage of said amplifier stages for said buffering and boosting of said output signal continuously in a second single ended amplifier stage thus resulting in a final gain adjusted strong output signal of said difference capacitance measurement.

49. A method for differential capacitance measurements, capable of evaluating small capacitance variations within a differential capacitor arrangement forming a transducer and thus apt for real-time evaluation and measurement of said differential capacitive transducers with high sensitivity and great noise immunity, comprising:

providing a sensor element with at least two variable transducer capacitors configured as a differential capacitor for an evaluation by the following measurement procedure;

providing a means for a real-time evaluation of the operational changes of said transducer capacitor values in form of a switched capacitor (SC) front-end deploying two input terminals for connecting said transducer capacitors and two output terminals for delivering an appropriate floating output signal as result of said evaluation measurement;

providing appropriate supply voltages for said means;

providing a means for the post processing of said output signal in form of amplifier stages for level and reference conversion, buffering and boosting of said output signal;

making available—within said SC front-end—appropriate supply voltages for charging each of said transducer capacitors with the help of two appropriate pairs of switches;

making available—within said SC front-end—a pair of internal storage capacitors together with two appropriate pairs of switches for transport of charges from said transducer capacitors to said internal storage capacitors;

making available—within said SC front-end—a 'difference' capacitor together with two appropriate pairs of switches for loading and unloading said 'difference' capacitor thus delivering said output signal as result of the evaluation measurement;

establishing a periodic timing schedule (consisting of three separate time segments) for the pertinent operation of the switches within said SC front-end for said charging of said transducer capacitors—in time segment I—, for said charge transport from said transducer capacitors to said internal storage capacitors—in time segment II and for said loading and unloading of said internal 'difference' capacitor—in time segment III;

determining for said SC front-end the charging and discharging of both of said transducer capacitors by means of two pairs of switches with regard to said appropriate corresponding supply voltages;

determining within said SC front-end the transport of charges from both of said transducer capacitors to said separate and respective internal storage capacitors by means of two pairs of switches;

determining within said SC front-end the transport of charges from both of said internal storage capacitors to said one internal 'difference' capacitor by means of one pair of switches, thus loading said internal 'difference' capacitor;

determining within said SC front-end the transfer of charge from said one internal 'difference' capacitor by means of one pair of switches to said output voltage terminals, thus unloading said internal 'difference' capacitor;

executing the charging of the first of said transducer capacitors and the discharging of the second of said transducer capacitors by means of the first pair of said switches with regard to said appropriate corresponding supply voltages during time segment I;

executing the transport of charges from both of said transducer capacitors to the first of said separate internal storage capacitors by means of the first pair of said switches during time segment I;

executing the discharging of the first of said transducer capacitors and the charging of the second of said transducer capacitors by means of the second pair of said switches with regard to said appropriate corresponding supply voltages during time segment II;

executing the transport of charges from both of said transducer capacitors to the second of said separate internal storage capacitors by means of the second pair of said switches during time segment I1;

executing the transport of charges from both of said internal storage capacitors to said one internal 'difference' capacitor by means of said one pair of switches, thus loading said internal 'difference' capacitor during time segment III;

executing the transfer of charge from said one internal 'difference' capacitor by means of said one other pair of switches to said output voltage terminals, thus unloading said internal 'difference' capacitor during time segment III, and thus furnishing a floating output voltage signal as said result of said evaluation measurement;

restarting the execution of the timing schedule from the beginning with segment I and repeating the according processing steps during time segments I, II and III continuously;

conditioning said floating output voltage signal as said result of said evaluation measurement at said output terminals continuously by amplifying the difference of said floating voltages within a first amplifier stage of said amplifier stages for said level and reference conversion; and conditioning further on the output voltage signal of said first amplifier stage of said amplifier stages for said buffering and boosting of said output signal continuously in a second single ended amplifier stage thus resulting in a final gain adjusted strong output signal of said difference capacitance measurement.

50. The method according to claim 49 wherein the operations and/or activities during said time segment I and/or said time segment II are repeated severalfold until a termination condition is fulfilled.

* * * * *